(12) United States Patent
Yamazaki et al.

(10) Patent No.: US 9,461,126 B2
(45) Date of Patent: Oct. 4, 2016

(54) TRANSISTOR, CLOCKED INVERTER CIRCUIT, SEQUENTIAL CIRCUIT, AND SEMICONDUCTOR DEVICE INCLUDING SEQUENTIAL CIRCUIT

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Masahiro Katayama, Tochigi (JP); Kenichi Okazaki, Tochigi (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 14/479,673

(22) Filed: Sep. 8, 2014

(65) Prior Publication Data
US 2015/0077162 A1 Mar. 19, 2015

(30) Foreign Application Priority Data
Sep. 13, 2013 (JP) ................. 2013-191185
Sep. 13, 2013 (JP) ................. 2013-191187

(51) Int. Cl.
*H03B 1/00* (2006.01)
*H03K 3/00* (2006.01)
(Continued)

(52) U.S. Cl.
CPC ............. *H01L 29/26* (2013.01); *H03K 3/037* (2013.01); *H03K 3/356121* (2013.01); *H03K 5/15093* (2013.01); *H03K 19/096* (2013.01); *H03K 19/09443* (2013.01)

(58) Field of Classification Search
CPC ................ H01L 29/26; H03K 19/096; H03K 3/356121

USPC ................ 327/108–112, 530, 534; 257/43
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Techology, 2003, vol. 26, pp. 181-184.

(Continued)

*Primary Examiner* — Lincoln Donovan
*Assistant Examiner* — Thomas Skibinski
(74) *Attorney, Agent, or Firm* — Fish & Richardson P.C.

(57) ABSTRACT

A transistor with excellent electrical characteristics (e.g., on-state current, field-effect mobility, or frequency characteristics) is provided. The transistor includes an oxide semiconductor layer including a channel formation region, a first gate electrode, a second gate electrode, a source electrode, and a drain electrode. The oxide semiconductor layer is between the first gate electrode and the second gate electrode. The oxide semiconductor layer has a pair of side surfaces in contact with the source electrode and the drain electrode and includes a region surrounded by the first gate electrode and the second gate electrode without the source electrode and the drain electrode interposed therebetween.

19 Claims, 23 Drawing Sheets

(51) Int. Cl.
  *H01L 29/26* (2006.01)
  *H03K 19/096* (2006.01)
  *H03K 3/356* (2006.01)
  *H03K 3/037* (2006.01)
  *H03K 5/15* (2006.01)
  *H03K 19/0944* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,243,873 B2 | 8/2012 | Koyama et al. |
| 8,362,538 B2 | 1/2013 | Koyama et al. |
| 8,363,778 B2 | 1/2013 | Koyama et al. |
| 8,384,080 B2 | 2/2013 | Taniguchi et al. |
| 8,564,331 B2 | 10/2013 | Yoneda |
| 8,582,716 B2 | 11/2013 | Koyama et al. |
| 8,593,856 B2 | 11/2013 | Koyama et al. |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1* | 12/2008 | Ryu ............... H01L 21/02554 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0193077 A1* | 8/2011 | Yamazaki ......... H01L 21/02554 257/43 |
| 2011/0221734 A1 | 9/2011 | Umezaki et al. |
| 2014/0056400 A1 | 2/2014 | Koyama et al. |
| 2014/0110704 A1 | 4/2014 | Yamazaki et al. |
| 2014/0110706 A1 | 4/2014 | Yamazaki |
| 2014/0131700 A1 | 5/2014 | Yamazaki |
| 2014/0131702 A1 | 5/2014 | Matsubayashi et al. |
| 2014/0306217 A1 | 10/2014 | Yamazaki et al. |
| 2014/0339538 A1 | 11/2014 | Yamazaki et al. |
| 2014/0339539 A1 | 11/2014 | Yamazaki et al. |
| 2014/0340608 A1 | 11/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-090761 A | 5/2011 |
| JP | 2011-124360 A | 6/2011 |
| JP | 2011-138934 A | 7/2011 |

(56) References Cited

FOREIGN PATENT DOCUMENTS

| | | |
|---|---|---|
| JP | 2011-209714 A | 10/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indiuma—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Diplay Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 :Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 SID : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical Properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

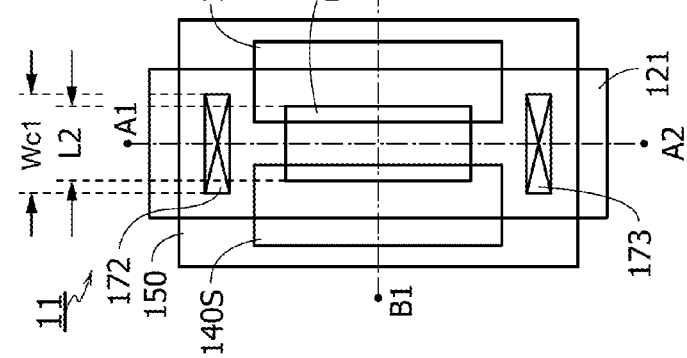
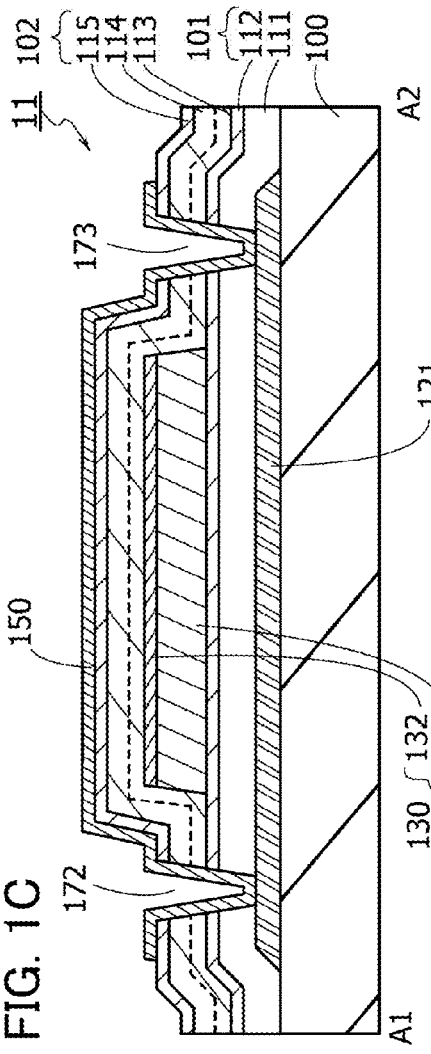
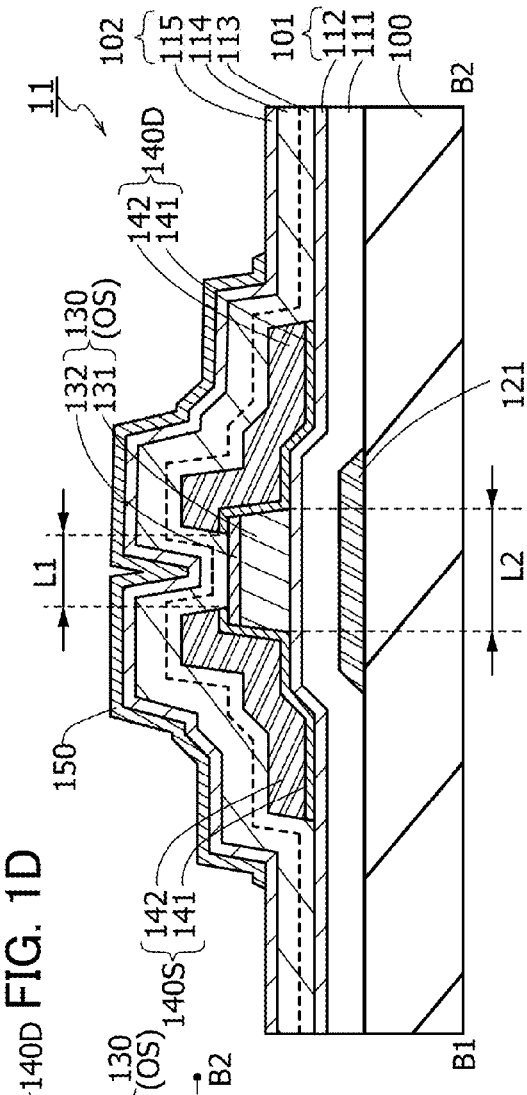

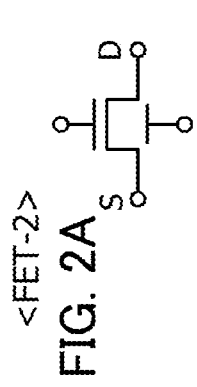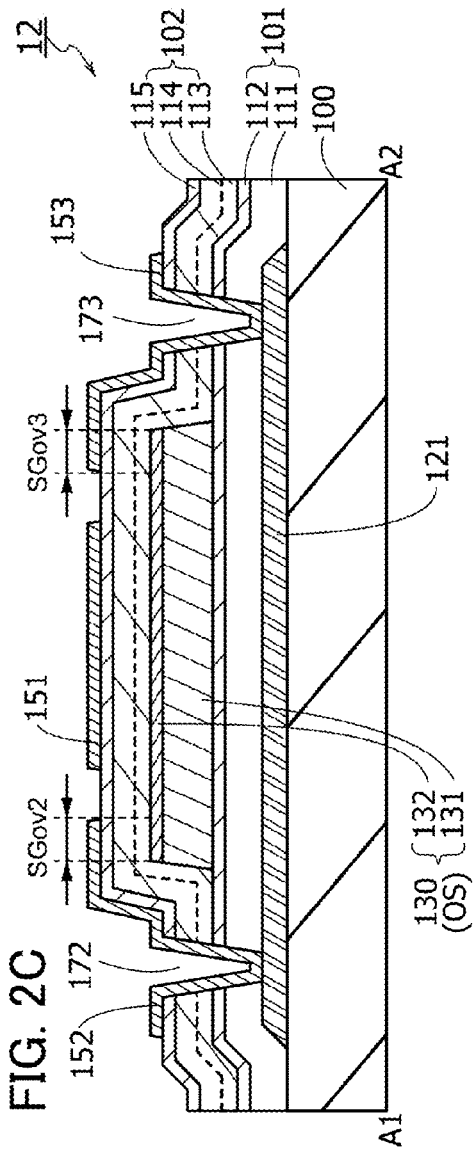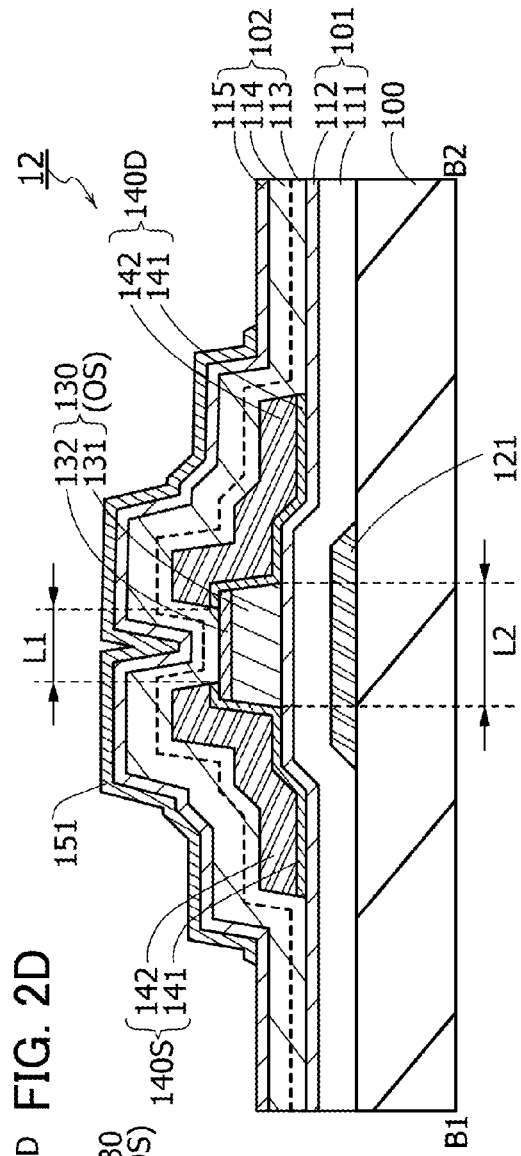

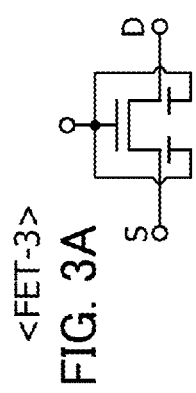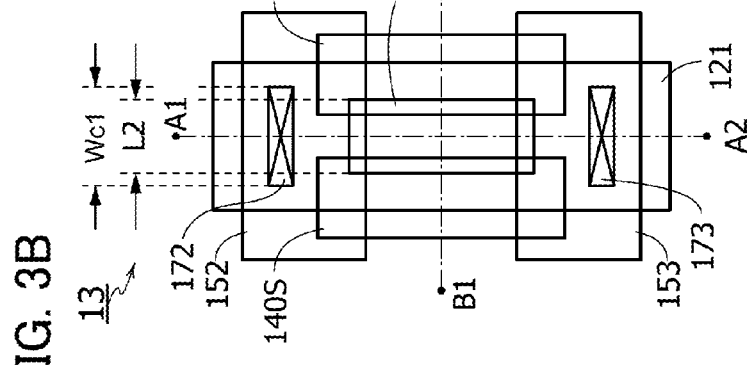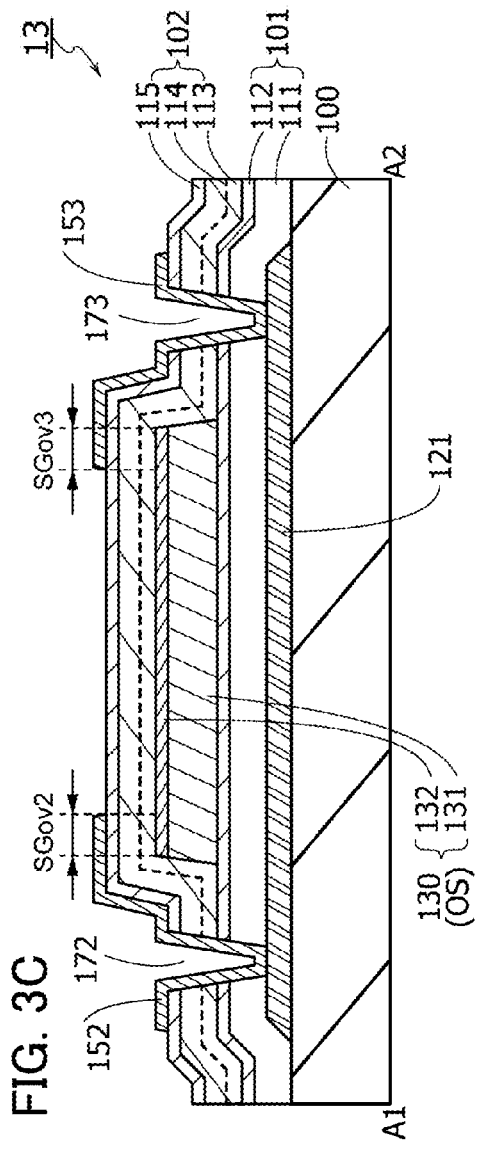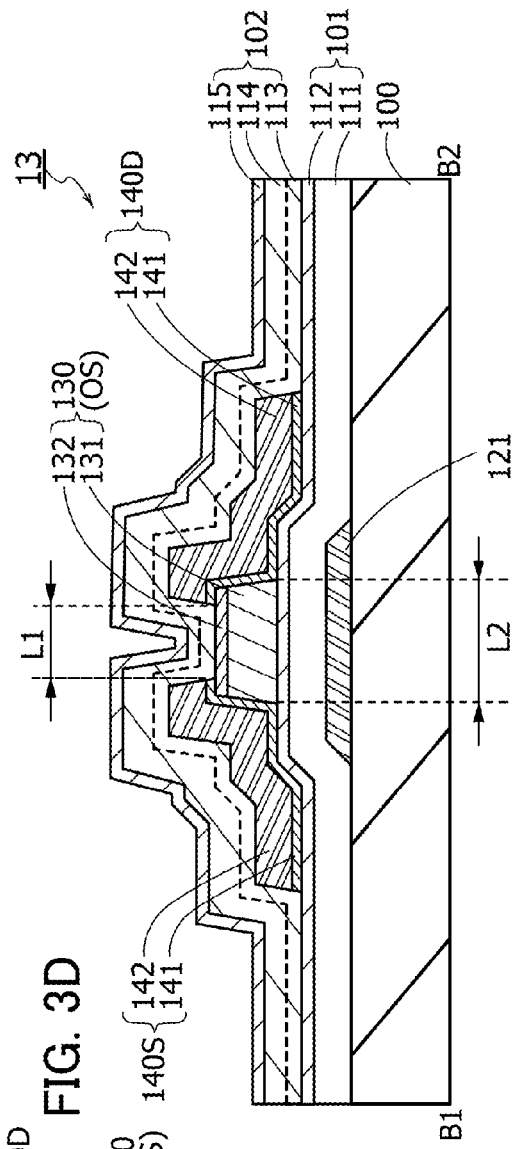

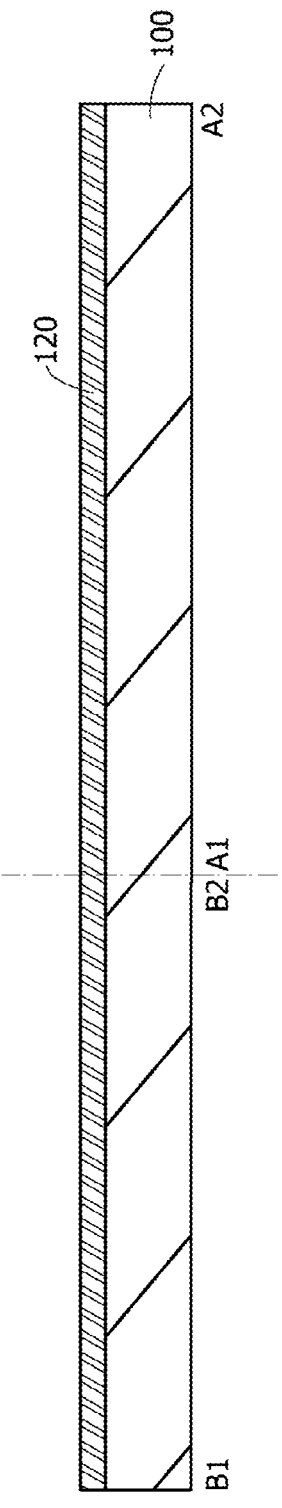
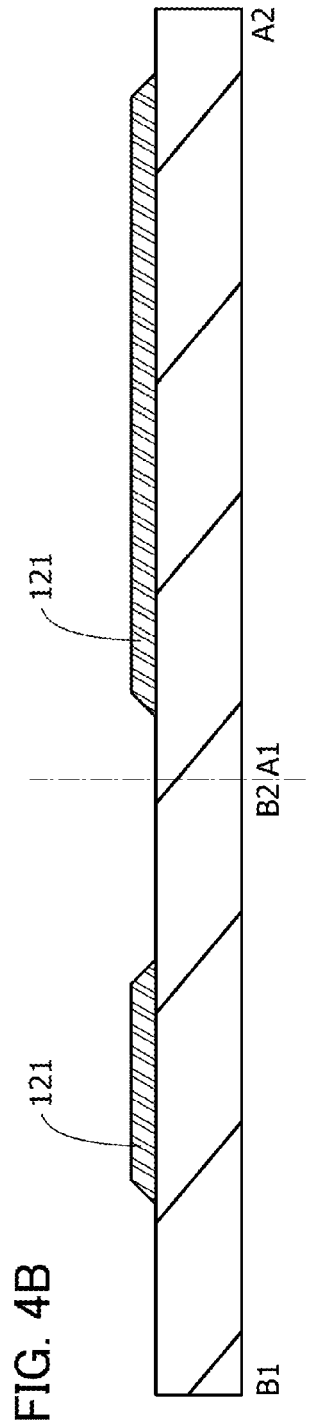
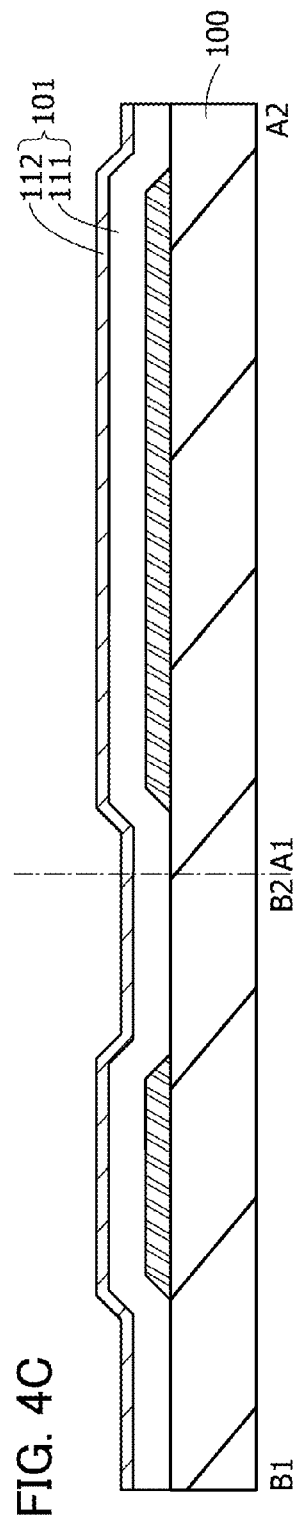
FIG. 4A
FIG. 4B
FIG. 4C

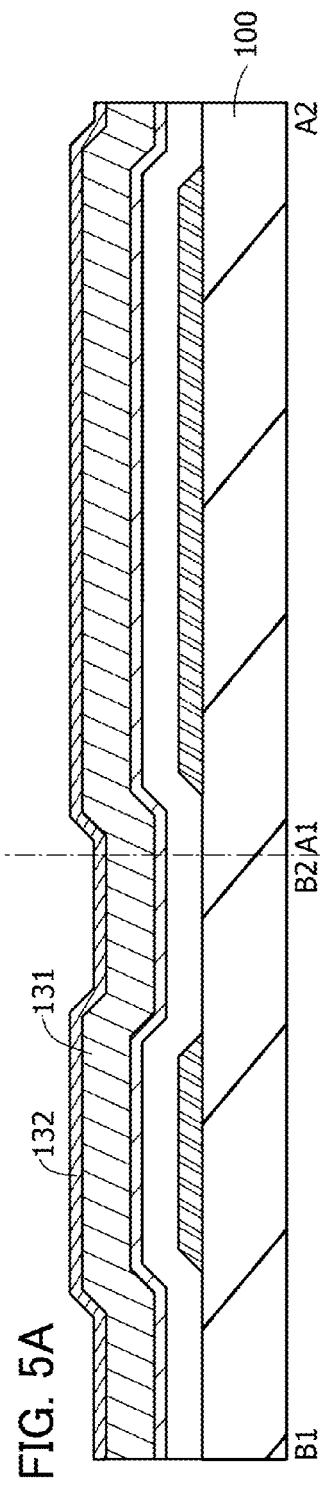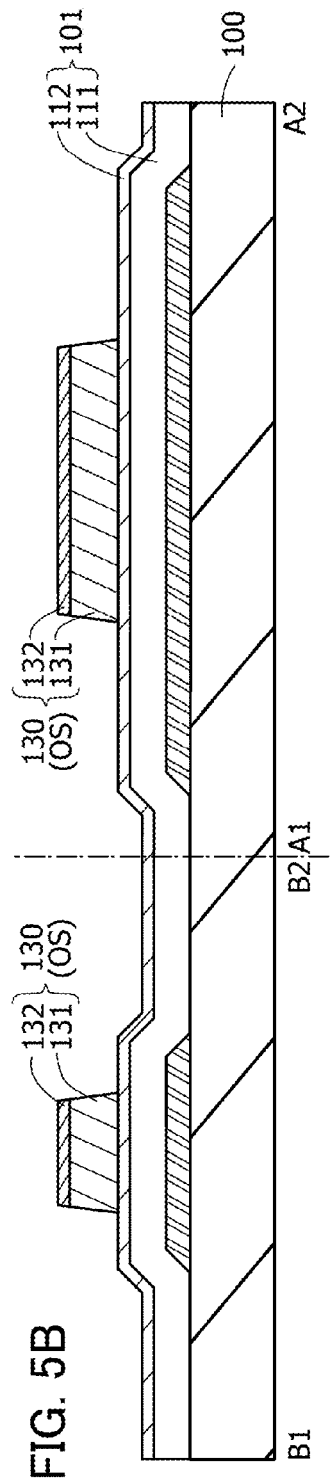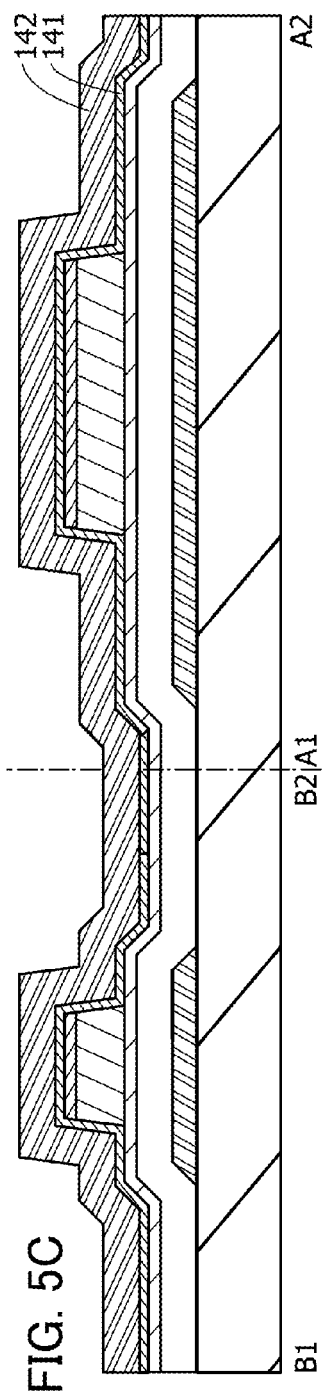

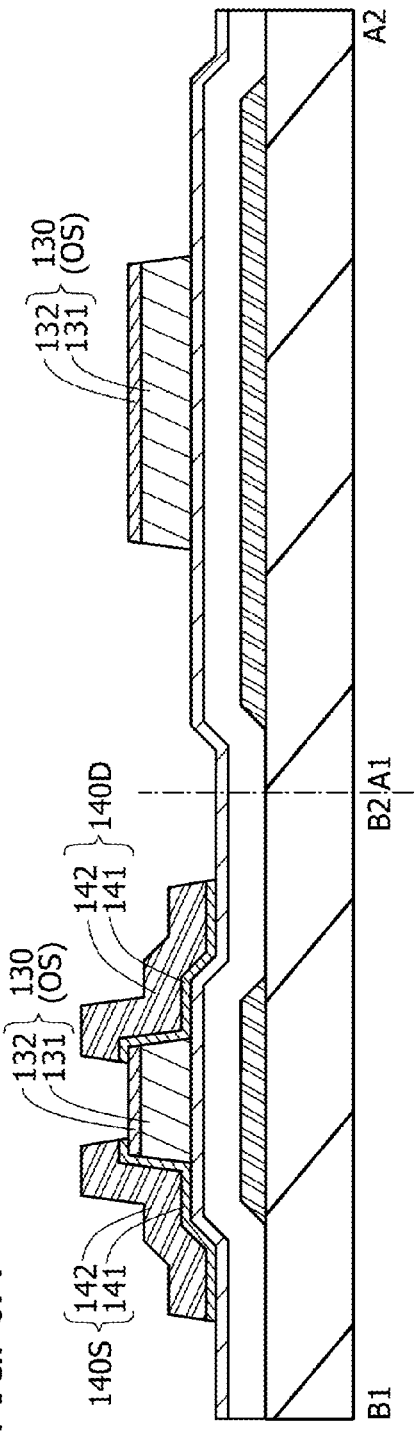
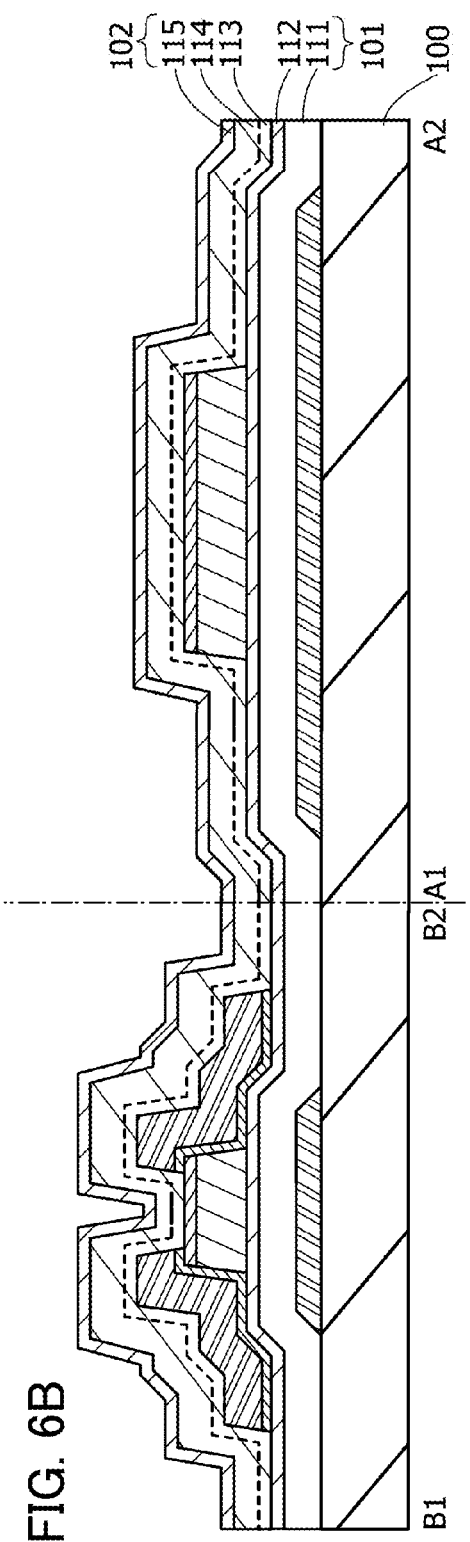

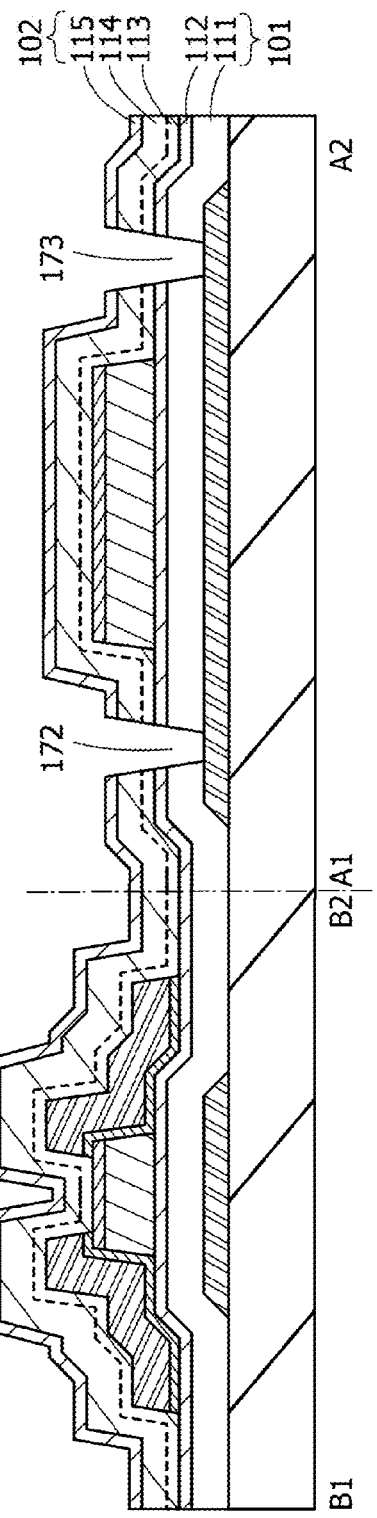
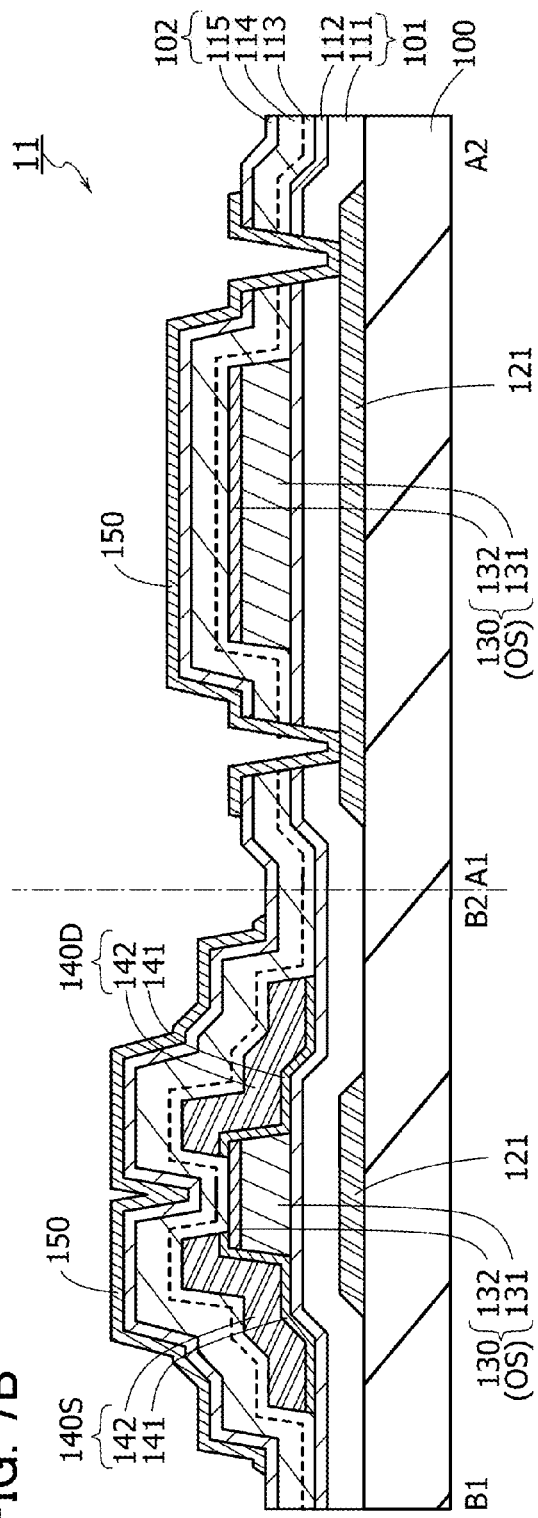

FIG. 8
FIG. 9A
INV-1
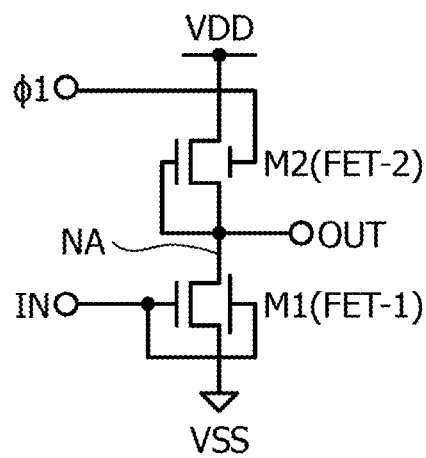
FIG. 9B
| IN | φ1 | OUT |
|----|-----|-----|
| H  | VH1 | L   |
| L  | VL1 | H   |

INV-2

INV-3

CAAC-OS nc-OS

TRANSISTOR, CLOCKED INVERTER CIRCUIT, SEQUENTIAL CIRCUIT, AND SEMICONDUCTOR DEVICE INCLUDING SEQUENTIAL CIRCUIT

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

Note that in this specification, a semiconductor device means a circuit including a semiconductor element (e.g., a transistor or a diode) and a device including the circuit. The semiconductor device also means any device that can function by utilizing semiconductor characteristics. For example, an integrated circuit, a chip including an integrated circuit, a display device, a light-emitting device, a lighting device, an electronic device, and the like include a semiconductor device in some cases.

2. Description of the Related Art

A transistor is applied to a wide variety of electronic devices such as an integrated circuit (IC) or an image display device (display device). As materials of a semiconductor that can be used in the transistor, silicon-based semiconductor materials have been widely known, but oxide semiconductors have been attracting attention as alternative materials.

For example, a transistor including an amorphous oxide semiconductor layer containing indium (In), gallium (Ga), and zinc (Zn) is disclosed in Patent Document 1.

Techniques for improving carrier mobility by employing a stacked structure of an oxide semiconductor layer are disclosed in Patent Documents 2 and 3.

Further, as one of means of downsizing and obtaining narrowed bezel of an active matrix display device, it has been known to form a driver circuit and a pixel portion on one substrate. Pixel circuits of the display device can be formed with either an n-channel transistor or a p-channel transistor. Accordingly, it is preferable to design a driver circuit with a single conductivity type transistor instead of using a CMOS circuit in order to manufacture a display device having a narrow bezel width with reduced number of manufacturing steps and manufacturing cost.

Main circuits of a driver circuit in a display device are shift registers. For example, Patent Documents 4 and 5 each disclose a shift register that includes a transistor using an oxide semiconductor layer.

REFERENCE

Patent Document

[Patent Document 1] Japanese Published Patent Application No. 2006-165528
[Patent Document 2] Japanese Published Patent Application No. 2011-138934
[Patent Document 3] Japanese Published Patent Application No. 2011-124360
[Patent Document 4] Japanese Published Patent Application No. 2011-090761
[Patent Document 5] Japanese Published Patent Application No. 2011-209714

SUMMARY OF THE INVENTION

An object of one embodiment of the present invention is to provide a semiconductor device whose threshold voltage can be controlled. Another object is to provide a semiconductor device with excellent electrical characteristics (e.g., on-state current, field-effect mobility, or frequency characteristics).

Another object of one embodiment of the present invention is to improve the reliability or drive frequency of a semiconductor device including transistors having the same conductivity type. Another object is to provide a novel semiconductor device.

Note that the description of a plurality of objects does not disturb the existence of each object. One embodiment of the present invention does not need to achieve all the objects. Objects other than those listed above are apparent from the description of the specification, drawings, and claims, and also such objects could be an object of one embodiment of the present invention.

One embodiment of the present invention is a transistor including an oxide semiconductor layer including a channel formation region; a first gate electrode and a second gate electrode; a first insulating layer and a second insulating layer; a source electrode; and a drain electrode. The first gate electrode faces the oxide semiconductor layer with the first insulating layer interposed therebetween. The second gate electrode faces the oxide semiconductor layer with the second insulating layer interposed therebetween and is in contact with the first gate electrode in at least one first opening in the first insulating layer and the second insulating layer. The oxide semiconductor layer includes a first side surface in contact with the source electrode and a second side surface in contact with the drain electrode; and a region surrounded by the first gate electrode and the second gate electrode.

One embodiment of the present invention is a semiconductor device including a transistor. The transistor includes an oxide semiconductor layer including a channel formation region; a first gate electrode and a second gate electrode; a first insulating layer and a second insulating layer; a source electrode; and a drain electrode. The oxide semiconductor layer is between the first gate electrode and the second gate electrode. The first gate electrode is under the oxide semiconductor layer with the first insulating layer interposed therebetween. The first gate electrode, the first insulating layer, the oxide semiconductor layer, the source electrode, and the drain electrode are covered with the second insulating layer. The second gate electrode is in contact with the first gate electrode in at least one first opening in the first insulating layer and the second insulating layer. The oxide semiconductor layer has a first side surface in contact with the source electrode and a second side surface in contact with the drain electrode and includes a region surrounded by the first gate electrode and the second gate electrode without the source electrode and the drain electrode interposed therebetween.

One embodiment of the present invention makes it possible to provide a semiconductor device whose threshold voltage can be controlled, a semiconductor device with excellent electrical characteristics (e.g., on-state current, field-effect mobility, or frequency characteristics), a highly reliable semiconductor device, or a semiconductor device in which a driver circuit and a pixel portion are formed over one substrate using an oxide semiconductor film. Furthermore, one embodiment of the present invention makes it possible to provide a novel semiconductor device.

Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

FIGS. 1A to 1D illustrate an example of a structure of a transistor: FIG. 1A illustrates a circuit symbol, FIG. 1B is a plan view, FIG. 1C is a cross-sectional view taken along line A1-A2 in FIG. 1B, and FIG. 1D is a cross-sectional view taken along line B1-B2 in FIG. 1B.

FIGS. 2A to 2D illustrate an example of a structure of a transistor: FIG. 2A illustrates a circuit symbol, FIG. 2B is a plan view, FIG. 2C is a cross-sectional view taken along line A1-A2 in FIG. 2B, and FIG. 2D is a cross-sectional view taken along line B1-B2 in FIG. 2B.

FIGS. 3A to 3D illustrate an example of a structure of a transistor: FIG. 3A illustrates a circuit symbol, FIG. 3B is a plan view, FIG. 3C is a cross-sectional view taken along line A1-A2 in FIG. 3B, and FIG. 3D is a cross-sectional view taken along line B1-B2 in FIG. 3B.

FIGS. 4A to 4C are cross-sectional views illustrating an example of a method for manufacturing a transistor.

FIGS. 5A to 5C are cross-sectional views illustrating an example of a method for manufacturing a transistor.

FIGS. 6A and 6B are cross-sectional views illustrating an example of a method for manufacturing a transistor.

FIGS. 7A and 7B are cross-sectional views illustrating an example of a method for manufacturing a transistor.

FIG. 8 illustrates a circuit symbol of an inverter circuit.

FIG. 9A is a circuit diagram illustrating an example of a configuration of an inverter circuit, and FIG. 9B is a truth table of the inverter circuit.

DETAILED DESCRIPTION OF THE INVENTION

Figure 10A:
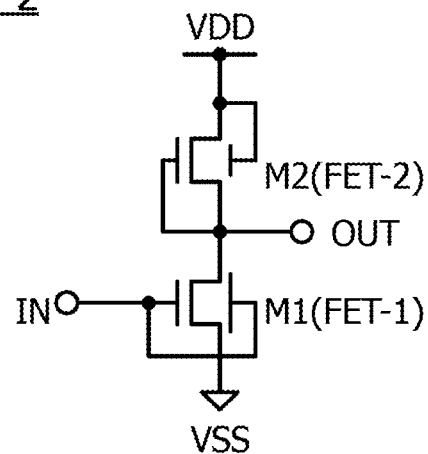
FIGS. 10A and 10B are circuit diagrams each illustrating an example of a configuration of an inverter circuit.

Hereinafter, embodiments of the present invention will be described in detail with reference to the accompanying drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the description of the embodiments below.

A plurality of embodiments of the present invention are described below. Needless to say, any of the embodiments can be combined as appropriate. In addition, in the case where structure examples are given in one embodiment, any of the structure examples can be combined as appropriate.

In the drawings used for the description of embodiments of the present invention, the same portions or portions having similar functions are denoted by the same reference numerals, and description thereof is not repeated in some cases.

Note that a transistor is an element having three terminals: a gate, a source, and a drain. Depending on the channel type of the transistor or levels of voltages applied to the terminals, one of two terminals (the source and the drain) functions as a source and the other of the two terminals functions as a drain. In general, in an n-channel transistor, a terminal to which low voltage is applied is called a source, and a terminal to which high voltage is applied is called a drain. In contrast, in a p-channel transistor, a terminal to which low voltage is applied is called a drain, and a terminal to which high voltage is applied is called a source. In the following description, to clarify circuit structure and circuit operation, one of two terminals of a transistor is fixed as a source and the other of the two terminals is fixed as a drain in some cases. It is needless to say that, depending on a driving method, the magnitude relationship between voltages applied to the terminals of the transistor might be changed, and the source and the drain might be interchanged.

In some cases, a transistor is additionally provided with a second gate for applying a voltage to a back channel. In such a case, to distinguish the two gates, the terminal that is generally called a gate is called a "front gate" and the other is called a "back gate" in this specification.

Embodiment 1

In this embodiment, a transistor is described as an example of a semiconductor device. The transistor described here is a bottom-gate transistor in which a front gate is on the substrate side with respect to a semiconductor layer where a channel is formed.

Structure Example 1

FET-1

FIG. 1A shows a circuit symbol of a transistor of Structure Example 1. The transistor includes two gates, a front gate and a back gate, and the back gate is connected to the front gate. Here, a transistor denoted by the circuit symbol in FIG. 1A is called FET-1.

Note that the circuit symbol in FIG. 1A indicates that the transistor (FET-1) has a device structure in which the width in the channel length direction of the back gate is longer than that of the front gate and the back gate overlaps with a source region and a drain region that are formed in a semiconductor layer. The device structure of FET-1 is described below with reference to FIGS. 1B to 1D.

FIGS. 1B to 1D illustrate an example of a device structure of FET-1. FIG. 1B is a top view of the transistor. FIG. 1C is a cross-sectional view taken along line A1-A2 in FIG. 1B, and FIG. 1D is a cross-sectional view taken along line B1-B2 in FIG. 1B. In other words, FIG. 1C is a cross-sectional view of the transistor in the channel width direction, and FIG. 1D is a cross-sectional view of the transistor in the channel length direction.

A transistor 11, which is formed over a substrate 100, includes an insulating layer 101, an insulating layer 102, a front gate electrode 121, an oxide semiconductor (OS) layer 130, a source electrode 140S, a drain electrode 140D, and a back gate electrode 150. In the channel width direction, an opening 172 and an opening 173 are formed in the insulating layers 101 and 102. The back gate electrode 150 is in contact with and is connected to the front gate electrode 121 in the openings 172 and 173.

The insulating layer 101 serves as a gate insulating layer for the front gate electrode 121, and the insulating layer 102 serves as a gate insulating layer for the back gate electrode 150.

In a transistor (hereinafter called Si transistor) in which a channel formation region is formed using Si, a source region and a drain region are formed by reducing the resistance of part of a Si layer by addition of an impurity to the Si layer. In contrast, in a transistor (hereinafter called OS transistor) in which a channel formation region is formed using an oxide semiconductor, a source electrode or a drain electrode is put in direct contact with an oxide semiconductor layer, whereby a device with electrical characteristics of a transistor can be obtained.

Accordingly, in the transistor 11, the source electrode 140S and the drain electrode 140D are in contact with the OS layer 130. In the transistor 11, to make the channel length short, regions where the OS layer 130 is in contact with the source electrode 140S and the drain electrode 140D exist mainly on side surfaces of the OS layer 130. Such regions exist also on the top surface of the OS layer 130. The regions where the OS layer 130 is in contact with the source electrode 140S and the drain electrode 140D exist also on the top surface of the OS layer 130 for the following purposes: to form the source electrode 140S and the drain electrode 140D, which are formed by etching common conductive films (141 and 142), with a small variation in size and high yield; and to make regions where the OS layer 130 is in contact with the source electrode 140S and the drain electrode 140D on the side surfaces of the OS layer 130 as large as possible.

Here, a length L1 of the OS layer 130 in FIG. 1D is the channel length of the transistor 11. The channel length L1 corresponds to the distance between the source electrode 140S and the drain electrode 140D on the top surface of the OS layer 130. A length L2 is the length of the OS layer 130 in the channel length direction. Since the regions where the OS layer 130 is in contact with the source electrode 140S and the drain electrode 140D exist on the side surfaces of the OS layer 130, the channel length L1 can be made short and the length L2 can be made as short as possible (close to L1). Consequently, the transistor 11 can have sufficient on-state current characteristics and improved frequency characteristics.

The channel length L1 may be 0.5 μm or greater, preferably 0.5 μm to 2 μm, further preferably 0.5 μm to 1 μm. The thickness of the OS layer 130 may be 150 nm or greater (e.g., 150 nm to 1.5 μm, preferably 250 nm to 1.5 μm). A specific structure of the OS layer 130 is described later. When the OS layer 130 includes two metal oxide films 131 and 132, the thickness of the first metal oxide film 131 may be 100 nm or greater (e.g., 100 nm to 1000 nm, preferably 200 nm to 1000 nm), and the thickness of the second metal oxide film 132 may be 50 nm or greater (e.g., 50 nm to 500 nm, or 100 nm to 300 nm).

The OS layer 130 is provided between the front gate electrode 121 and the back gate electrode 150. The back gate electrode 150 is longer than the OS layer 130 in the channel length and channel width directions. The OS layer 130 is entirely covered with the back gate electrode 150 with the insulating layer 102 interposed therebetween. In the planar layout in FIG. 1B, the OS layer 130 exists inside the back gate electrode 150.

In the channel width direction, the opening 172 and the opening 173 are formed in the insulating layers 101 and 102. The back gate electrode 150 is in contact with and is connected to the front gate electrode 121 in the openings 172 and 173. Such a connection structure not only makes the potential of the back gate electrode 150 equal to that of the front gate electrode 121 but also contributes to improved electrical characteristics of the transistor 11.

As shown in FIG. 1C, the OS layer 130 includes a region surrounded by the front gate electrode 121 and the back gate electrode 150 without the source electrode 140S and the drain electrode 140D interposed between the front gate electrode 121 and the back gate electrode 150. With such a device structure, the OS layer 130 can be electrically surrounded by electric fields from the front gate electrode 121 and the back gate electrode 150. A device structure of a transistor in which, as in the transistor 11, an OS layer where a channel is formed is electrically surrounded by electric fields from gate electrodes (121 and 150) can be called a surrounded channel (s-channel) structure.

Since the transistor 11 has an s-channel structure, an electric field for inducing a channel can be effectively applied to the OS layer 130 by the front gate electrode 121; thus, the transistor 11 can have improved current drive capability, which leads to high on-state current characteristics. High on-state current allows the transistor 11 to be miniaturized.

Moreover, since the transistor 11 has a structure surrounded by the front gate electrode 121 and the back gate electrode 150, the transistor 11 can have high mechanical strength.

In FIG. 1C, current flows in the direction perpendicular to the paper. Therefore, in order that an electric field from the front gate electrode 121 is effectively applied to the OS layer 130, a length Wc1 of each of the openings 172 and 173 in the channel length direction is preferably longer than the length L2 of the OS layer 130. In that case, portions of the back gate electrode 150 that are in the openings 172 and 173 make it possible to efficiently apply an electric field to the entire side surfaces of the OS layer 130 in the channel width direction.

Films and the like included in the transistor 11 are described below.

(Substrate)

There is no particular limitation on the material and the like of the substrate 100. The substrate 100 needs, if it serves as a support substrate during formation of the transistor 11, heat resistance enough to withstand at least heat treatment performed in a formation process of the transistor 11. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 100. Furthermore, any of these substrates provided with a device such as a transistor or a capacitor (this substrate is called a backplane substrate) may be used as the substrate 100.

In some cases, the substrate 100 is different from a substrate that serves as a support substrate during formation of the transistor 11. In that case, the substrate 100 may have low heat resistance and does not particularly need rigidity; therefore, without being limited to the above substrates, the substrate 100 may be a flexible substrate such as a resin substrate. In that case, when the transistor 11 is formed, part or whole of the transistor 11 is formed over a support substrate with a separation layer (a layer containing tungsten oxide, molybdenum oxide, or the like) and a base insulating layer interposed therebetween. Then, the support substrate including the separation layer is separated, and the substrate 100 is fixed to the base insulating layer with a resin material.

(Front Gate Electrode and Back Gate Electrode)

The front gate electrode 121 and the back gate electrode 150 each can be formed using a conductor with a single-layer structure or a stacked-layer structure of two or more layers. Examples of the conductor include a metal, an alloy, a metal compound (e.g., a metal oxide, a metal nitride, or a silicide), and silicon containing phosphorus. Another element or a compound may be added to the conductor containing a metal.

Examples of a metal used for the conductor include aluminum, chromium, copper, tantalum, titanium, molybdenum, tungsten, manganese, and zirconium.

Examples of a metal oxide include indium oxide, an In—Sn oxide (ITO), and an In—Zn oxide. Tungsten oxide or silicon oxide may be added to any of these metal oxides. A metal oxide can be used as a light-transmitting conductor.

For example, in the case where the front gate electrode 121 and the back gate electrode 150 each have a two-layer structure, a film in which an aluminum film is stacked over a titanium film, a film in which a titanium film is stacked over a titanium nitride film, a film in which a tungsten film is stacked over a titanium nitride film, a film in which a tungsten film is stacked over a tantalum nitride film or a tungsten nitride film, a film in which a copper film is stacked over a titanium film, or the like may be used. In the case where the front gate electrode 121 and the back gate electrode 150 each have a three-layer structure, for example, a film in which a titanium film, an aluminum film, and a titanium film are stacked in this order may be used.

Here, the front gate electrode 121 is formed using a single-layer conductor. For example, the front gate electrode 121 can be formed using a tungsten film with a thickness of 80 nm to 200 nm. The back gate electrode 150 is also formed using a single-layer conductor. For example, the back gate electrode 150 can be formed using an In—Sn oxide (ITO) film with a thickness of 80 nm to 200 nm.

(Source Electrode and Drain Electrode)

Like the front gate electrode 121, the source electrode 140S and the drain electrode 140D can be formed using a conductor with a single-layer structure or a stacked-layer structure of two or more layers. Examples of the conductor include a metal, an alloy, a metal compound (e.g., a metal oxide, a metal nitride, or a silicide), and silicon containing phosphorus. Another element or a compound may be added to the conductor containing a metal.

Examples of a metal used for the conductor include aluminum, chromium, copper, silver, tantalum, titanium, molybdenum, tungsten, manganese, and zirconium.

In the case where the source electrode 140S and the drain electrode 140D have a two-layer structure, the second layer is preferably formed thick using a low-resistance metal such as aluminum or copper, and the first layer, which is in direct contact with the OS layer 130, is preferably formed using a conductor that serves as a barrier layer against a conductor of the second layer or a conductor that does not degrade characteristics of the OS layer 130. Similarly, in the case where the front gate electrode 121 and the back gate electrode 150 are each formed using conductors with a three-layer structure, the first layer and the third layer are preferably formed using a conductor that serves as a barrier layer against a conductor of the second layer.

In the case where the source electrode 140S and the drain electrode 140D have a two-layer structure, a film in which an aluminum film is stacked over a titanium film, a film in which a copper film is stacked over a tungsten film, a film in which an aluminum film is stacked over a tungsten film, a film in which a copper film is stacked over a copper-magnesium-aluminum alloy film, a film in which a copper film is stacked over a titanium film, or the like may be used. In the case where the source electrode 140S and the drain electrode 140D have a three-layer structure, a structure in which each of the first and third layers is a film made of titanium, titanium nitride, molybdenum, or molybdenum nitride and the second layer is a low-resistance film made of aluminum or copper may be used.

(Insulating Layer)

Each of the insulating layers 101 and 102 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, a tantalum oxide film, and a Ga—Zn oxide film.

Each of the insulating layers 101 and 102 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), hafnium oxide, or yttrium oxide, so that gate leakage current of the transistor 11 on the back gate side and the front gate side can be reduced. The insulating films can be formed by a sputtering method, a CVD method, an MBE method, an ALD method, or a PLD method.

Note that in this specification, an oxynitride refers to a substance that contains more oxygen than nitrogen, and a nitride oxide refers to a substance that contains more nitrogen than oxygen.

In the case where the insulating layer 101 has a multilayer structure, an insulating film in contact with the OS layer 130 is preferably an insulator containing oxygen (e.g., an oxide or an oxynitride). Here, the insulating layer 101 has a two-layer structure of an insulating film 111 and an insulating film 112. The insulating film 111 is a silicon nitride film, and the insulating film 112 is a silicon oxynitride film.

In the case where the insulating layer 102 has a multilayer structure, an insulating film in contact with the OS layer 130 is preferably an insulator containing oxygen (e.g., an oxide or an oxynitride). The insulating layer 102 preferably includes at least an oxide insulating film containing oxygen at a higher proportion than that in the stoichiometric composition. Part of oxygen is released by heating from the oxide insulating film which contains oxygen at a higher proportion than that in the stoichiometric composition. The oxide insulating film containing oxygen at a higher proportion than that in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectrometry (TDS) analysis. Note that the temperature of the film surface in the TDS analysis is preferably higher than or equal to 100° C. and lower than or equal to 700° C., or higher than or equal to 100° C. and lower than or equal to 500° C.

Here, the insulating layer 102 has a stacked-layer structure of insulating films 113 to 115. The insulating films 113 and 114 are silicon oxynitride films, and the insulating film 115 is a silicon nitride film.

The thickness of the insulating film 114 may be 30 nm to 500 nm, preferably 50 nm to 400 nm. As the insulating film 114, instead of the silicon oxynitride film, a silicon oxide film or the like may be formed.

The insulating film 114, which is the second layer, is formed as an oxide insulating film that supplies oxygen to the OS layer 130, and contains oxygen at a higher proportion than that in the stoichiometric composition. The insulating film 114 preferably has few defects. Typically, the spin density of the insulating film 114 calculated from a signal which appears at around g=2.001 and is measured by electron spin resonance (ESR) is preferably lower than $1.5\times10^{18}$ spins/cm$^3$, more preferably lower than or equal to $1\times10^{18}$ spins/cm$^3$. Electron spins at g=2.001 are typically electron spins due to dangling bonds of silicon.

The insulating film 113 serves as a path of oxygen released from the insulating film 114 to the OS layer 130, and therefore is preferably an insulating film through which oxygen passes and which contains oxygen. The insulating film 113 also serves as a barrier layer for the OS layer 130 during formation of the insulating films 114 and 115.

Note that in the insulating film 113, all oxygen having entered the insulating film 113 from the outside moves to the outside of the insulating film 113 in some cases. In other cases, some oxygen remains in the insulating film 113. In other cases, movement of oxygen occurs in the insulating film 113 in such a manner that oxygen enters the insulating film 113 and oxygen contained in the insulating film 113 moves to the outside of the insulating film 113.

The insulating film 113, which is in contact with the OS layer 130, preferably has fewer defects than the insulating film 114. The insulating film 113 is preferably a silicon oxide film or a silicon oxynitride film whose spin density calculated from an ESR signal which appears at around g=2.001 is lower than or equal to $3\times10^{17}$ spins/cm$^3$ and whose spin density calculated from an ESR signal which appears at around g=1.93 (e.g., 1.89 to 1.96) is lower than or equal to $1\times10^{17}$ spins/cm$^3$, preferably lower than or equal to the lower limit of detection.

The thickness of the insulating film 113 is 5 nm to 150 nm, preferably 5 nm to 50 nm.

As the uppermost layer of the insulating layer 102, the insulating film 115 having a function of blocking hydrogen and oxygen is preferably formed. Preferably, the insulating film 115 has an effect of blocking oxygen, hydrogen, water, an alkali metal, an alkaline earth metal, and the like. Thus, the insulating film 115 can prevent entry of an impurity such as hydrogen to the OS layer 130 and release of oxygen from the OS layer 130. Here, a silicon nitride film is formed as the insulating film 115.

The thickness of the insulating film 115 may be 50 nm to 300 nm, preferably 100 nm to 200 nm. As the insulating film 115, a film made of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, hafnium oxynitride, or the like can be formed.

(Oxide Semiconductor (OS) Layer)

The OS layer 130 has a single-layer structure or a stacked-layer structure formed using a metal oxide. The OS layer 130 includes at least one semiconductor film formed using a metal oxide (oxide semiconductor film) where a channel formation region is provided. Examples of a metal oxide that can be used for the OS layer 130 include indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide (also referred to as IGZO), an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—Zr—Zn oxide, an In—Ti—Zn oxide, an In—Sc—Zn oxide, an In—Y—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

An oxide semiconductor serving as a channel formation region in the OS layer 130 preferably contains at least indium (In) or zinc (Zn). Typical examples of such an oxide semiconductor include an In—Ga—Zn oxide and an In—Sn—Zn oxide. The oxide semiconductor may also contain an element serving as a stabilizer for reducing a variation in electrical characteristics. Examples of such an element include Ga, Sn, Hf, Al, and Zr.

Here, an "In—Ga—Zn oxide" means an oxide containing In, Ga, and Zn as its main components and there is no particular limitation on the ratio of In to Ga and Zn. The In—Ga—Zn oxide may contain another metal element in addition to In, Ga, and Zn.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the OS transistor shifts in the negative direction.

It is preferable that hydrogen be reduced as much as possible as well as oxygen vacancies in the OS layer 130 (at least the region where a channel is formed). Specifically, in the OS layer 130, the concentration of hydrogen which is measured by secondary ion mass spectrometry (SIMS) is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than or equal to $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$.

When silicon or carbon which is one of elements belonging to Group 14 is contained in the OS layer 130, oxygen vacancies are increased and the resistance of the OS layer 130 is reduced. Thus, the concentration of silicon or carbon (the concentration is measured by SIMS) of the OS layer 130 is set to lower than or equal to $2 \times 10^{18}$ atoms/cm$^3$, preferably lower than or equal to $2 \times 10^{17}$ atoms/cm$^3$.

The concentration of alkali metal or alkaline earth metal in the OS layer 130, which is measured by SIMS, is set to lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the OS layer 130.

Furthermore, when nitrogen is contained in the oxide semiconductor, electrons serving as carriers are generated and carrier density is increased, which is likely to cause a reduction in the resistance of the oxide semiconductor. For this reason, the concentration of nitrogen in the OS layer 130 is preferably reduced as much as possible; the concentration of nitrogen which is measured by SIMS is preferably set to, for example, lower than or equal to $5 \times 10^{18}$ atoms/cm$^3$.

The OS layer 130 preferably contains a c-axis aligned crystalline oxide semiconductor (CAAC-OS) in the channel formation region. This is because the CAAC-OS structure has a lower density of defect states than that of each of a polycrystalline structure, a microcrystalline structure, and an amorphous structure. Note that the crystal structure of a metal oxide contained in the OS layer 130 is described in Embodiment 4.

A metal oxide contained in the OS layer 130 may have two or more of a microcrystalline structure, a polycrystalline structure, a CAAC-OS structure, and a single-crystal structure. The OS layer 130 includes, for example, two or more of a region having a microcrystalline structure, a region having a polycrystalline structure, a CAAC-OS region, and a region having a single-crystal structure in some cases. Furthermore, the OS layer 130 has a layered structure of two or more of a region having a microcrystalline structure, a region having a polycrystalline structure, a CAAC-OS region, and a region having a single-crystal structure in some cases.

The OS layer 130 can be a single-layer metal oxide or a stack of two or more metal oxide films. When the OS layer 130 has a stacked-layer structure, the metal oxide films forming the OS layer 130 preferably contain at least one same metal. For example, when the OS layer 130 is a stack of In-M-Zn oxide (M is Ga, Y, Zr, La, Ce, or Nd) films, the atomic ratio of In to M and Zn in each film is adjusted as appropriate. It is also possible to use In as a common metal element in the stack and combine any of an In-M-Zn oxide film, an In-M oxide film, and an In—Zn oxide film as appropriate.

For example, when the metal oxide film 131 is an In—Ga—Zn oxide film, the metal oxide film 132 can be an In—Ga—Zn oxide film containing more Ga than the metal oxide film 131 does or an In—Ga oxide film.

Here, the OS layer 130 has a two-layer structure of the metal oxide film 131 and the metal oxide film 132. The metal oxide film 131 on the front gate electrode 121 side is an oxide semiconductor film where a channel formation region exists. The metal oxide film 132 preferably serves as a barrier layer for preventing damage to the metal oxide film 131 in the formation step of the conductive films (141 and 142) and the etching step of the conductive films (141 and 142) in the formation process of the source electrode 140S and the drain electrode 140D, and therefore is preferably denser than the metal oxide film 131.

With the metal oxide film 132, a channel formation region (the metal oxide film 131) can be away from the interface between the insulating layer 102 (gate insulating layer) and the OS layer 130. Thus, even if a trap state is formed at the interface, charge that flows in the channel is less likely to be trapped by the trap state. This results in an increase in the on-state current and field-effect mobility of the transistor 11.

Furthermore, as described above, since a channel is formed in the metal oxide film 131 in the transistor 11, the source electrode 140S and the drain electrode 140D only need to be in contact with at least side surfaces of the metal oxide film 131; therefore, the metal oxide film 132 does not need to have a source region or a drain region. Accordingly, the metal oxide film 132 is not necessarily an oxide semiconductor and can be a high-resistance film. The metal oxide film 132 can be formed using an insulator with very high contact resistance to the source electrode 140S and the drain electrode 140D and infinite resistance. This means a wide choice of films that can be used as the metal oxide film 132.

Accordingly, the metal oxide film 132 can be formed thick. Thus, the metal oxide film 132 can serve as a protective film for the metal oxide film (oxide semiconductor film) 131. In that case, the metal oxide film 132 can prevent diffusion of copper into the OS layer 130 (the metal oxide film 131). This makes it easy to use a copper material, which easily diffuses, for the source electrode 140S and the drain electrode 140D in the transistor 11, which is a so-called channel-etched bottom-gate transistor.

In the OS layer 130, the thickness of the metal oxide film 131 may be 100 nm or greater (e.g., 100 nm to 1000 nm, preferably 200 nm to 1000 nm), and the thickness of the metal oxide film 132 may be 50 nm or greater (e.g., 50 nm to 500 nm, preferably 100 nm to 300 nm).

For example, in the case where In—Ga—Zn oxide films are formed as the metal oxide film 131 and the metal oxide film 132 by a sputtering method, an In—Ga—Zn oxide target in which an atomic ratio of In to Ga and Zn is 1:1:1 or 1:3:2 can be used as a sputtering target for forming the metal oxide film 131, and an In—Ga—Zn oxide target in which an atomic ratio of In to Ga and Zn is 1:3:2, 1:3:4, or 1:3:6 can be used as a sputtering target for forming the metal oxide film 132. In this manner, an In—Ga—Zn oxide film containing more Ga than the metal oxide film 131 does can be formed as the metal oxide film 132.

For example, in the case where an In—Ga—Zn oxide film is formed as the metal oxide film 131 by a sputtering method and an In—Ga oxide film is formed as the metal oxide film 132 by a sputtering method, an In—Ga—Zn oxide target in which an atomic ratio of In to Ga and Zn is 1:1:1 or 1:3:2 can be used as a sputtering target for forming the metal oxide film 131, and an In—Ga oxide target in which an atomic ratio of In to Ga is 7:93 can be used as a sputtering target for forming the metal oxide film 132. In this manner, an In—Ga oxide film containing more Ga than In can be formed as the metal oxide film 132. Such a Ga-rich In—Ga oxide film is suitable for a Cu diffusion prevention film.

Structure Example 2

FET-2

The transistor of Structure Example 2 is a variation of the transistor of Structure Example 1. Potentials or signals can be input independently to a back gate and a front gate of the transistor. FIG. 2A shows a circuit symbol of a transistor of Structure Example 2. The transistor includes two gates, the front gate and the back gate, and the back gate is not connected to the front gate. Here, a transistor denoted by the circuit symbol in FIG. 2A is called FET-2.

FIGS. 2B to 2D illustrate an example of a device structure of FET-2. FIG. 2B is a top view of the transistor. FIG. 2C is a cross-sectional view taken along line A1-A2 in FIG. 2B, and FIG. 2D is a cross-sectional view taken along line B1-B2 in FIG. 2B. In other words, FIG. 2C is a cross-sectional view of the transistor in the channel width direction, and FIG. 2D is a cross-sectional view of the transistor in the channel length direction.

A transistor 12, which is formed over the substrate 100, includes the insulating layer 101, the insulating layer 102, the front gate electrode 121, the OS layer 130, the source electrode 140S, the drain electrode 140D, a back gate electrode 151, an electrode 152, and an electrode 153. In the channel width direction, the opening 172 and the opening 173 are formed in the insulating layers 101 and 102. In the openings 172 and 173, the electrode 152 and the electrode 153 are in contact with the front gate electrode 121. In the transistor 12, the back gate electrode 151 is not connected to the front gate electrode 121.

The transistor 12 has a device structure in which the back gate electrode 150 in the transistor 11 is divided into the three electrodes (151 to 153). Like the transistor 11, the transistor 12 has an s-channel structure and therefore has improved frequency characteristics and on-state current characteristics.

In the transistor 12, as shown in FIG. 2C, the OS layer 130 includes a region surrounded by the front gate electrode 121, the back gate electrode 151, the electrode 152, and the electrode 153 without the source electrode 140S and the drain electrode 140D interposed between the front gate electrode 121, the back gate electrode 151, the electrode 152, and the electrode 153. The front gate electrode 121 and the electrodes 152 and 153 are connected in the manner shown in the drawing; thus, these electrodes can surround the bottom surface, two opposite side surfaces, and the top surface of the OS layer 130, and the OS layer 130 can be electrically surrounded by an electric field from the front gate electrode 121. The electrodes 152 and 153 serve as part of a front gate, and can be called side gate electrodes because they face the side surfaces of the OS layer 130 as shown in FIG. 2C.

In addition, the back gate electrode 150 in the transistor 11 can be called a back gate electrode including a pair of side gate electrodes (FIG. 1C).

As shown in FIG. 2C, the electrode 152 and the electrode 153 each have a region that faces the top surface of the OS layer 130 with the insulating layer 102 interposed therebetween. That is, in the channel width direction, widths SGov2 and SGov3 of the regions of the electrodes 152 and 153 that face the top surface of the OS layer 130 have values greater than zero.

A potential or a signal different from that of the front gate electrode 121 can be input to the back gate electrode 151; thus, the threshold voltage (hereinafter also called Vth or threshold value) of the transistor 12 can be shifted in the positive direction or the negative direction by a potential or a signal that is input to the back gate electrode 151. By controlling Vth of the transistor 12, the transistor 12 can be switched between an enhancement mode and a depletion mode as appropriate during operation.

Structure Example 3

FET-3

The transistor of Structure Example 3 is a variation of the transistor of Structure Example 2. The transistor does not have a back gate. FIG. 3A shows a circuit symbol of a transistor of Structure Example 3. Here, a transistor denoted by the circuit symbol in FIG. 3A is called FET-3.

FIGS. 3B to 3D illustrate an example of a device structure of FET-3. FIG. 3B is a top view of the transistor. FIG. 3C is a cross-sectional view taken along line A1-A2 in FIG. 3B, and FIG. 3D is a cross-sectional view taken along line B1-B2 in FIG. 3B. In other words, FIG. 3C is a cross-sectional view of the transistor in the channel width direction, and FIG. 3D is a cross-sectional view of the transistor in the channel length direction.

A transistor 13, which is formed over the substrate 100, includes the insulating layer 101, the insulating layer 102, the front gate electrode 121, the OS layer 130, the source electrode 140S, the drain electrode 140D, the electrode 152, and the electrode 153. In the channel width direction, the opening 172 and the opening 173 are formed in the insulating layers 101 and 102. In the openings 172 and 173, the electrode 152 and the electrode 153 are in contact with the front gate electrode 121.

The transistor 13 corresponds to the transistor 12 without the back gate electrode 151. In the transistor 13, as shown in FIG. 3C, the OS layer 130 includes a region (the bottom surface, two opposite side surfaces, and the top surface) surrounded by a conductive film including the front gate electrode 121, the electrode 152, and the electrode 153 without the source electrode 140S and the drain electrode 140D interposed between the front gate electrode 121, the electrode 152, and the electrode 153. Thus, like the transistors 11 and 12, the transistor 13 has an s-channel structure and therefore has improved frequency characteristics and on-state current characteristics.

As shown in FIG. 3C, the electrode 152 and the electrode 153 each have a region that faces the top surface of the OS layer 130 with the insulating layer 102 interposed therebetween. The circuit symbol in FIG. 3A indicates that FET-3 includes such side gate electrodes (151 and 152).

<Variations>

Variations of transistors are described below.

In the transistor 11, one of the openings 172 and 173 may be formed to connect the back gate electrode 150 to the front gate electrode 121. The transistor 12 or the transistor 13 may have a device structure in which one of the electrodes 152 and 153 is formed.

Each of the transistors 11 to 13 has an s-channel structure including a side gate electrode, a back gate electrode, or both of them; however, the transistor may have a device structure without a side gate electrode and a back gate electrode. Such a transistor does not have an s-channel structure but has, like the transistor 11, a device structure in which the source electrode 140S and the drain electrode 140D are in contact with side surfaces of the OS layer 130; therefore, the channel length L1 can be made short and the length L2 can be made as short as possible (close to L1). Consequently, the transistor can have sufficient on-state current characteristics and improved frequency characteristics.

<<Circuit Including Transistors Having the Same Conductivity Type>>

The transistors (FET-1 to FET-3) are n-channel transistors because their channel formation regions are each formed using an oxide semiconductor. Configuration examples of a circuit including transistors having the same conductivity type are described below. FET-1 to FET-3 are used as transistors in the circuit.

<Inverter Circuit>

For example, a fundamental logic circuit (e.g., a buffer circuit, an inverter circuit, a clocked inverter circuit, a NAND circuit, or a NOR circuit) can be formed using transistors having the same conductivity type. Here, an inverter circuit is described. FIG. 8 shows a circuit symbol of an inverter circuit.

Figure 10B:
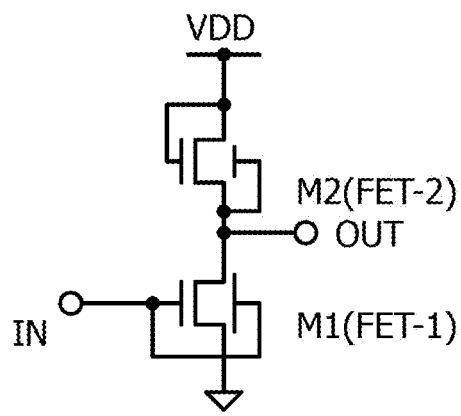

Inverter circuits (INV-1, INV-2, and INV-3) in FIG. 9A, FIG. 10A, and FIG. 10B each include a transistor M1 and a transistor M2 that are connected in series. The transistor M1 has the device structure of FET-1, and the transistor M2 has the device structure of FET-2. Using such transistors (FET-1 and FET-2) with improved on-state current characteristics and frequency characteristics makes it possible to provide an inverter circuit with low power consumption and a high operating frequency.

In the following description, the inverter circuit (INV-1) might be abbreviated to INV-1. The same applies to other circuits, elements, voltages, signals, and the like.

(INV-1)

FIG. 9A is a circuit diagram of INV-1, and FIG. 9B is a truth table thereof. Note that in FIG. 9B, data values are represented by potential levels. "H" represents a high-level potential at which the transistor M1 is turned on. "L" represents a low-level potential at which the transistor M1 is turned off.

INV-1 includes an input terminal (IN) and an output terminal (OUT). VDD and VSS are supplied as power supply voltages to INV-1. VDD, which is a high power supply voltage, is input to a drain of the transistor M2. VSS, which is a low power supply voltage, is input to a source of the transistor M1.

In the transistor M1, a back gate is connected to a front gate, the front gate is connected to a terminal (IN), and a drain is connected to a terminal (OUT). In the transistor M2, a front gate is connected to a source, the source is connected to a terminal (OUT), and a signal $\phi 1$ is input to a back gate.

The signal $\phi 1$ may be a signal with fluctuating potential levels or a signal with a constant potential level. For example, as shown in FIG. 9B, the signal $\phi 1$ can be a signal whose potential level fluctuates in accordance with a signal input to the terminal (IN). The potential of the signal $\phi 1$ becomes VH1 when the terminal (IN) is set at a high level, and becomes VL1 when the terminal (IN) is set at a low level.

In this case, for example, a signal $\phi 1$ such that current flow in the transistor M2 is decreased when the transistor M1 is on and current flow in the transistor M2 is increased when the transistor M1 is off may be supplied to the transistor M2. VH1 is a potential to apply a voltage higher than that of the source (positive bias voltage) to the back gate of the transistor M2. Thus, it is possible to make the threshold voltage of the transistor M2 lower than that at the time when no voltage is applied to the back gate. VL1 is a potential to apply a voltage lower than that of the source (negative bias voltage) to the back gate of the transistor M2. Thus, it is possible to make the threshold voltage of the transistor M2 higher than that at the time when no voltage is applied to the back gate.

A node NA is discharged at low speed when the transistor M1 is on and is charged at high speed when the transistor M1 is off; thus, INV-1 can have low power consumption and high operation speed.

(INV-2)

The inverter circuit (INV-2) in FIG. 10A is a variation of INV-1. INV-2 has a circuit configuration in which the back gate of the transistor M2 is connected to the drain of the transistor M2.

In INV-2, VDD is applied to the back gate of the transistor M2, which means that a positive bias voltage is applied to the back gate of the transistor M2.

(INV-3)

The inverter circuit (INV-3) in FIG. 10B is a variation of INV-2. INV-3 corresponds to a circuit in which the connection of the front gate of the transistor M2 and the connection of the back gate of the transistor M2 in INV-2 are replaced with each other. In the transistor M2, the front gate is connected to the drain, and the back gate is connected to the source.

Although the inverter circuits are formed using FET-1 and FET-2 here, a transistor of any other structure example in this embodiment can be used. For example, in INV-1 to INV-3, FET-3 may be used as the transistor M1. Alternatively, a transistor without a back gate electrode and a side gate electrode may be used as the transistor M1.

<Clocked Inverter Circuit>

A clocked inverter circuit (CINV) including transistors having the same conductivity type will be described.

Figure 11A:
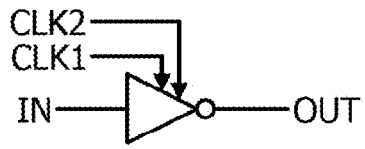
FIG. 11A illustrates a circuit symbol of a clocked inverter circuit.
Figure 11B:
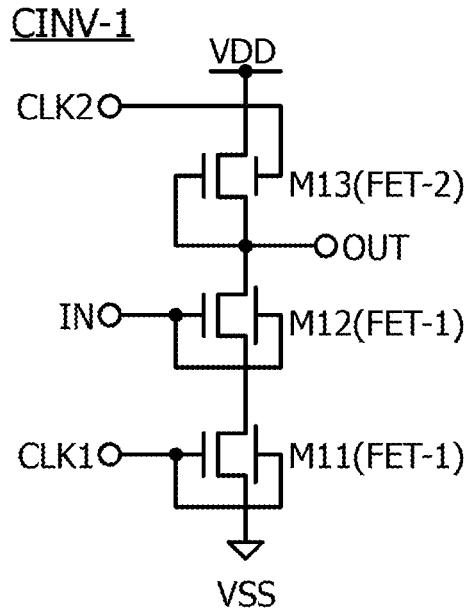
FIGS. 11B and 11C are circuit diagrams each illustrating an example of a configuration of a clocked inverter circuit.
Figure 11C:
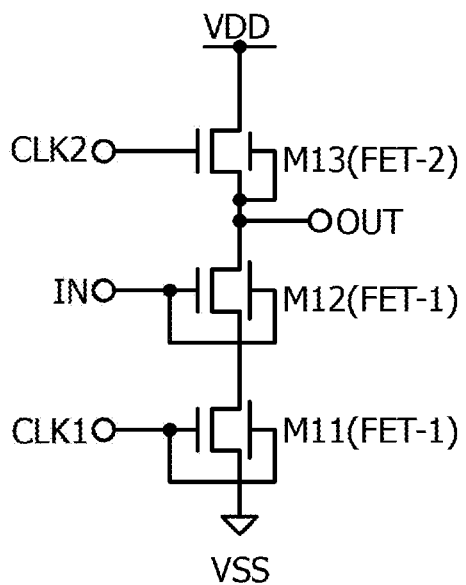

FIG. 11A shows a circuit symbol of a clocked inverter circuit. FIGS. 11B and 11C illustrate configuration examples of a clocked inverter circuit.

Clocked inverter circuits (CINV-1 and CINV-2) in FIG. 11B and FIG. 11C each include three transistors M11, M12, and M13 that are connected in series. Each of the transistors M11 and M12 has the device structure of FET-1, and the transistor M13 has the device structure of FET-2. Using such transistors (FET-1 and FET-2) with improved on-state current characteristics and frequency characteristics makes it possible to provide a clocked inverter circuit with low power consumption and a high operating frequency.

(CINV-1)

As shown in FIG. 11B, CINV-1 corresponds to a circuit in which the transistor M11 is connected between the transistor M1 and a VSS input terminal of INV-1 (FIG. 9A). In the transistor M11, a clock signal (CLK1) is input to a front gate, and a back gate is connected to the front gate. In the transistor M12, a terminal (IN) and a back gate are connected to a front gate, and a drain is connected to a terminal (OUT). In the transistor M13, a front gate is connected to a source, the source is connected to a terminal (OUT), and a clock signal (CLK2) is input to a back gate.

CINV-1 serves as an inverter circuit when CLK1 is at a high level. When CLK1 is at a low level, the terminal (OUT) is in a high-impedance state. CLK2 is used as a signal for controlling Vth of the transistor M13. The transistor M13 can be switched between an enhancement mode and a depletion mode in accordance with CLK2.

For example, a signal at the same level as CLK1 can be input as CLK2. In that case, when CLK1 is at a high level, M11 is turned on and Vth of M13 is shifted to the negative side. When CLK1 is at a low level, M11 is turned off and Vth of M13 is shifted to the positive side.

(CINV-2)

As shown in FIG. 11C, CINV-2 corresponds to a circuit in which the connection of the front gate of M13 and the connection of the back gate of M13 in CINV-1 are replaced with each other, and operates in a manner similar to that of CINV-1.

<Latch Circuit>

Figure 12A:
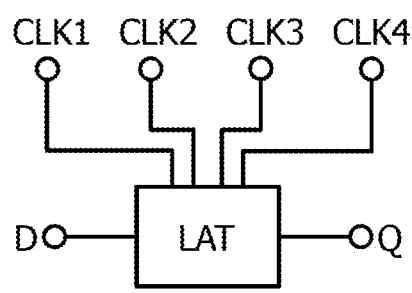
FIG. 12A illustrates a circuit symbol of a latch circuit.
Figure 12B:
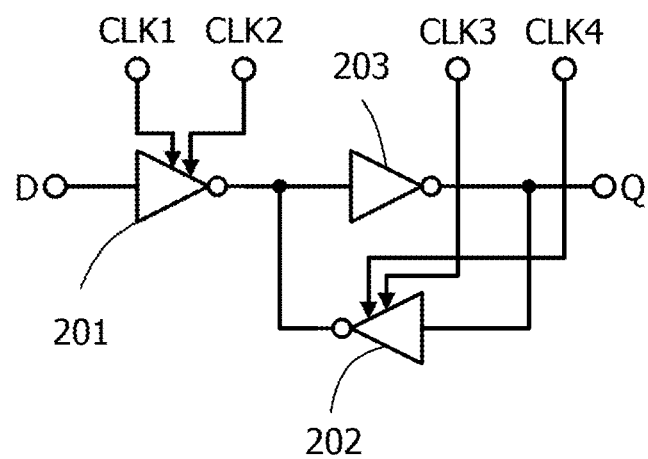
FIG. 12B is a circuit diagram illustrating an example of a configuration of the latch circuit.

A configuration example of a latch circuit is described as an example of a sequential circuit. FIG. 12A is a block diagram illustrating an example of a configuration of a latch circuit, and FIG. 12B is a circuit diagram of the latch circuit.

A latch circuit (LAT) 200 includes clocked inverter circuits 201 and 202 and an inverter circuit 203. The inverter circuit 203 and the clocked inverter circuit 202 form a loop circuit including two inverters. An input terminal of the loop circuit is connected to an input terminal (D) via the clocked inverter circuit 201.

Here, by using any of INV-1 to INV-3 as the inverter circuit 203 and any of CINV-1 and CINV-2 as the clocked inverter circuits 201 and 202, a latch circuit that includes transistors having the same conductivity type and is capable of rapid start-up can be obtained.

The phases of clock signals CLK1 and CLK3 are inverted from each other. CLK2 is a signal for controlling Vth of the transistor M13 in the clocked inverter circuit 201, and CLK4 is a signal for controlling Vth of the transistor M13 in the clocked inverter circuit 202.

<Shift Register>

Figure 13:
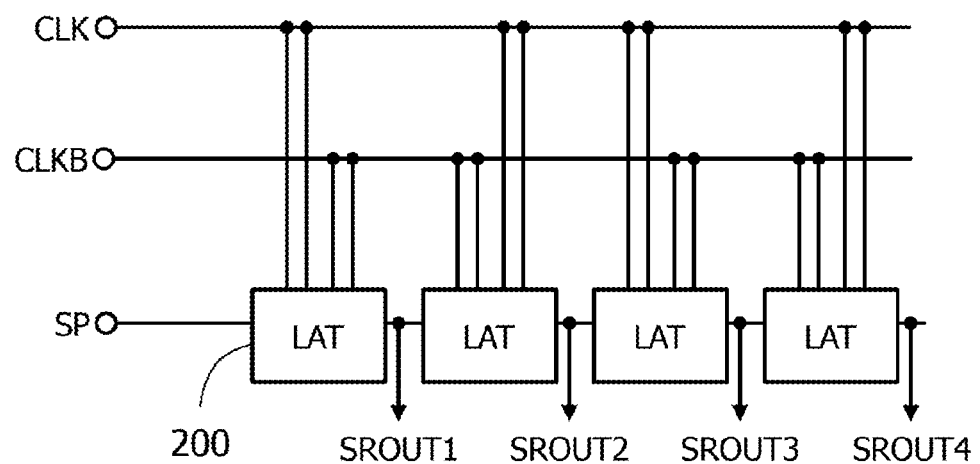
FIG. 13 is a circuit diagram illustrating a configuration example of a shift register.

A configuration example of a shift register is described as an example of a sequential circuit. As shown in FIG. 13, a plurality of LATs can be connected in series to form a shift register 210. In the shift register 210, the phases of clock signals CLK and CLKB are inverted from each other. An output terminal of LAT is connected to an input terminal of LAT in the next stage, and a start pulse signal SP is input to the input terminal D of LAT in the first stage. In response to rises of the clock signal CLK or CLKB, a start pulse signal input to LAT in the first stage is sequentially transferred to LATs in the following stages and also is output as signals SROUT1 to SROUT4 from output terminals.

The shift register 210 can be used for, for example, a gate driver circuit and a source driver circuit of an active matrix display device. An active matrix display device is described in Embodiment 3.

Embodiment 2

In this embodiment, a method for manufacturing the transistor of Embodiment 1 is described. Here, a method for manufacturing the transistor 11 (FET-1) will be described as an example.

FIGS. 4A to 4C, FIGS. 5A to 5C, FIGS. 6A and 6B, and FIGS. 7A and 7B are cross-sectional views illustrating an example of a method for manufacturing the transistor 11. In these drawings, a cross-sectional view in the channel length direction (B1-B2) is on the left side and a cross-sectional view in the channel width direction (A1-A2) is on the right side.

Films of the transistor 11 (e.g., an insulating film, a semiconductor film, an oxide semiconductor film, a metal oxide film, and a conductive film) can be formed by a sputtering method, a chemical vapor deposition (CVD) method, a vacuum evaporation method, a pulse laser deposition (PLD) method, a coating method, or a printing method. Although typical deposition methods are a sputtering method and a plasma-enhanced CVD (PECVD) method, a thermal CVD method can also be used. A metal organic CVD (MOCVD) method or an atomic layer deposition (ALD) method may be employed as an example of a thermal CVD method.

Deposition by a thermal CVD method is performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, a thermal CVD method has an advantage that no defect due to plasma damage is caused.

Deposition by an ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust the thickness and thus is suitable for manufacturing a minute transistor. An example of a method for manufacturing the transistor 11 is described below with reference to drawings.

Here, a glass substrate is used as the substrate 100. First, as shown in FIG. 4A, a conductive film 120 to be the front gate electrode 121 is formed over the substrate 100. As the conductive film 120, a 100-nm-thick tungsten film is formed by a sputtering method.

Alternatively, a tungsten film can be formed with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Then, a resist mask RM1 (not shown) is formed over the conductive film 120 through a photolithography process using a first photoresist mask. The tungsten film is etched using the resist mask RM1, whereby the front gate electrode 121 is formed (FIG. 4B). After that, the resist mask RM1 is removed.

In an etching step in the manufacturing process of the transistor 11, wet etching, dry etching, or both of them are performed.

The front gate electrode 121 can also be formed by an electrolytic plating method, a printing method, an ink-jet method, or the like.

Next, as shown in FIG. 4C, the insulating layer 101 is formed to cover the front gate electrode 121. The insulating layer 101 can be formed by a sputtering method, a CVD method, an evaporation method, or the like. Here, a 400-nm-thick silicon nitride film as the insulating film 111 and a 50-nm-thick silicon oxynitride film as the insulating film 112 are formed by a PECVD method.

Films included in the insulating layer 101 may be formed by a thermal CVD method. For example, in the case where a hafnium oxide film is formed, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed, two kinds of gases, e.g., H$_2$O as an oxidizer and a source gas which is obtained by vaporizing a solvent and liquid containing an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed, hexachlorodisilane is adsorbed on a deposition surface, chlorine contained in the adsorbate is removed, and radicals of an oxidizing gas (e.g., O$_2$ or dinitrogen monoxide) are supplied to react with the adsorbate.

Next, as shown in FIG. 5A, a stacked film of the metal oxide films 131 and 132 to be the OS layer 130 is formed over the insulating layer 101.

Each of the metal oxide films 131 and 132 can be formed with a deposition apparatus employing ALD. In the case where an In—Ga—Zn oxide film is formed, for example, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

In the case where the metal oxide films 131 and 132 are formed by a sputtering method, as a power supply device for generating plasma, an RF power supply device, an AC power supply device, a DC power supply device, or the like can be used as appropriate.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably high. Further, a target may be appropriately selected in accordance with the compositions of the metal oxide films 131 and 132 to be formed.

In order to obtain a highly purified intrinsic or substantially highly purified intrinsic oxide semiconductor film, it is necessary to highly purify a sputtering gas as well as to evacuate a chamber to a high vacuum. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the metal oxide films 131 and 132 can be minimized.

Here, a 300-nm-thick In—Ga—Zn oxide film is formed as the metal oxide film 131 by a sputtering method using an In—Ga—Zn oxide target (In:Ga:Zn=3:1:2). The metal oxide film 131 is formed as an oxide semiconductor film. Furthermore, a 50-nm-thick In—Ga oxide film is formed as the metal oxide film 132 by a sputtering method using an In—Ga oxide target (In:Ga=7:93). The metal oxide film 132 is formed as an oxide semiconductor film or an insulating film.

Next, a resist mask RM2 (not shown) is formed over the metal oxide film 132 through a photolithography process using a second photoresist mask, and then the stacked film of the metal oxide film 131 and the metal oxide film 132 is subjected to element isolation carried out by a wet etching method using the resist mask RM2, whereby the OS layer 130 is formed. Then, the resist mask RM2 is removed (FIG. 5B).

After the formation of the OS layer 130, for example, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. This heat treatment, which is one of treatments for purifying an oxide semiconductor, can reduce hydrogen, water, and the like contained in the OS layer 130.

A stacked film of the conductive film 141 and the conductive film 142 is formed to cover the OS layer 130 and the insulating layer 101 (FIG. 5C). Here, a 50-nm-thick tungsten film (141) and a 300-nm-thick copper film (142) are formed by a sputtering method.

The conductive film 141 may be formed by an ALD method. In that case, the conductive film 141 can be formed without plasma damage to the OS layer 130.

Note that in the case where the front gate electrode 121 (including an electrode formed with the same layer) is connected to the source electrode 140S and the drain electrode 140D (including an electrode formed with the same layer), openings for the connection are formed in the insulating layer 101 before the formation of the conductive films 141 and 142. In this case, a resist mask RM3 is formed over the insulating layer 101 and the OS layer 130 through a photolithography process using a third photoresist mask and etching is performed using the resist mask RM3 to form the openings in the insulating layer 101. After removal of the resist mask RM3, the conductive films 141 and 142 are formed.

Then, a resist mask RM4 (not shown) is formed over the conductive film 142 through a photolithography process using a fourth photoresist mask. The stacked film (141 and 142) is etched using the resist mask RM4, whereby the source electrode 140S and the drain electrode 140D are formed (FIG. 6A).

For example, the copper film (142) is etched by a wet etching method and the tungsten film (141) is etched by a dry etching method using SF$_6$; thus, a fluoride is formed on a surface of the copper film. The fluoride prevents diffusion of copper from the copper film into the OS layer 130. Furthermore, the metal oxide film 132 of the OS layer 130 serves as an etching protective film for the metal oxide film 131 and as a barrier layer against a metal that diffuses from the conductive films 141 and 142. Thus, this structure can prevent degradation of electrical characteristics and a decrease in reliability of the transistor 11.

After removal of the resist mask RM4, the insulating layer 102 is formed to cover the insulating layer 101, the OS layer 130, the source electrode 140S, and the drain electrode 140D (FIG. 6B).

Here, the insulating film 113 and the insulating film 114 are formed in succession. To form films in succession means to form the first film and then form the second and subsequent films without exposing a process substrate to the air.

Successive formation can reduce the concentration of impurities attributed to the atmospheric component at the interface between stacked films.

As the insulating film 113 and the insulating film 114, a 50-nm-thick silicon oxynitride film and a 400-nm-thick silicon oxynitride film, respectively, are formed. Deposition conditions of a PECVD apparatus are changed, whereby two silicon oxynitride films are formed. As a source gas of the silicon oxynitride films, a deposition gas containing silicon and an oxidizing gas are preferably used. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case where the PECVD apparatus is used, the insulating film 113 can be formed under the following conditions. The source gas is silane and dinitrogen monoxide. The flow rate of silane is 30 sccm, and the flow rate of dinitrogen monoxide is 4000 sccm. The pressure in a treatment chamber is 200 Pa, and the substrate temperature is 220° C. A high-frequency power of 150 W is supplied to parallel-plate electrodes of the PECVD apparatus with the use of a 27.12 MHz high-frequency power source. Under the above conditions, a silicon oxynitride film through which oxygen passes can be formed.

In the same treatment chamber, the insulating film 114 is formed without exposure to the air. The insulating film 114 can be formed under the following conditions. The source gas is the same as that for the insulating film 113. The flow rate of silane is 200 sccm, and the flow rate of dinitrogen monoxide is 4000 sccm. The pressure in the treatment chamber is 200 Pa, and the substrate temperature is 220° C. A high-frequency power of 1500 W is supplied to parallel-plate electrodes of the PECVD apparatus with the use of a 27.12 MHz high-frequency power source.

Here, the PECVD apparatus described as an example is a parallel plate PECVD apparatus having an electrode area of 6000 cm$^2$. The power per unit area (power density) into which the power supplied during deposition of the insulating film 114 is converted is 0.25 W/cm$^2$.

Deposition of the insulating film 113 with a PECVD apparatus is preferably performed under the following conditions: the substrate temperature is higher than or equal to 280° C. and lower than or equal to 400° C., the pressure is greater than or equal to 20 Pa and less than or equal to 250 Pa, preferably greater than or equal to 100 Pa and less than or equal to 250 Pa, and a high-frequency power is supplied to an electrode provided in a treatment chamber. Under these conditions, it is also possible to form a silicon oxide film by selecting appropriate gases from the above examples of source gases.

Under these conditions, a silicon oxynitride film or silicon oxide film through which oxygen passes can be formed as the insulating film 113. Furthermore, owing to the substrate temperature higher than or equal to 280° C. and lower than or equal to 400° C., the bonding strength of silicon and oxygen becomes strong. Thus, a dense and hard silicon oxynitride film or silicon oxide film through which oxygen passes can be formed. Typically, a silicon oxynitride film or silicon oxide film of which etching using hydrofluoric acid of 0.5 wt % at 25° C. is performed at a rate of lower than or equal to 10 nm/min, preferably lower than or equal to 8 nm/min can be formed.

In the case where hydrogen, water, and the like are contained in the OS layer 130, the hydrogen, water, and the like can be removed in this step because the insulating film 113 is formed while heating is performed. Hydrogen contained in the OS layer 130 is bonded to an oxygen radical formed in plasma to form water. Since the substrate is heated, water formed by bonding of oxygen and hydrogen is released from the OS layer 130. That is, when the insulating film 113 is formed by a PECVD method, the amount of water and hydrogen contained in the OS layer 130 can be reduced.

Further, time for heating in a state where the OS layer 130 is exposed can be shortened because the OS layer 130 is heated in a step of forming the insulating film 113. Thus, release of oxygen from the OS layer 130 by heat treatment can be prevented. By setting the pressure in the treatment chamber to greater than or equal to 100 Pa and less than or equal to 250 Pa, the amount of water contained in the insulating film 113 is reduced; thus, fluctuations in electrical characteristics of the transistor 11 can be reduced and change in threshold voltage can be inhibited.

It is preferable to reduce damage to the OS layer 130 as much as possible during deposition of the insulating film 113 for the following reason. When the insulating film 114 is formed under conditions such that the amount of defects in the film is decreased, the amount of oxygen released from the insulating film 114 is likely to be reduced. This makes it difficult to sufficiently reduce defects in the OS layer 130 by oxygen supply from the insulating film 114 in some cases. In view of this, by setting the pressure in the treatment chamber to greater than or equal to 100 Pa and less than or equal to 250 Pa, damage to the OS layer 130 during deposition of the insulating film 113 can be reduced.

Note that when the ratio of the amount of the oxidizing gas to the amount of the deposition gas containing silicon is 100 or higher, the hydrogen content in the insulating film 113 can be reduced. Consequently, the amount of hydrogen entering the OS layer 130 can be reduced; thus, a negative shift of the threshold voltage of the transistor can be inhibited.

In the case where the PECVD apparatus is used, the insulating film 114 can be formed under the following conditions. The substrate temperature is higher than or equal to 180° C. and lower than or equal to 280° C., preferably higher than or equal to 200° C. and lower than or equal to 240° C. The pressure in the treatment chamber is greater than or equal to 100 Pa and less than or equal to 250 Pa, preferably greater than or equal to 100 Pa and less than or equal to 200 Pa. A high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode of the PECVD apparatus.

The high-frequency power having the above power density is supplied to the treatment chamber having the above pressure, whereby the decomposition efficiency of the source gas in plasma is increased, oxygen radicals are increased, and oxidation of the source gas is promoted; therefore, the oxygen content in the insulating film 114 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Consequently, it is possible to form a silicon oxynitride film which contains oxygen at a higher proportion than that in the stoichiometric composition and from which part of oxygen is released by heating.

The insulating film 113 is provided over the OS layer 130. Accordingly, in the process for forming the insulating film 114, the insulating film 113 serves as a protective film of the OS layer 130. Therefore, the insulating film 114 can be formed using the high-frequency power having high power density while damage to the OS layer 130 is reduced.

Heat treatment is performed after the formation of the insulating films 113 and 114. By the heat treatment, part of oxygen contained in the insulating film 114 can be moved to the OS layer 130, so that the amount of oxygen vacancies contained in the OS layer 130 can be further reduced. After the heat treatment, the insulating film 115 is formed.

In the case where water, hydrogen, or the like is contained in the insulating film 113 and the insulating film 114 and the insulating film 115 having a function of blocking water, hydrogen, and the like is formed, if heat treatment is performed after the formation of the insulating film 115, water, hydrogen, or the like contained in the insulating film 113 and the insulating film 114 is moved to the OS layer 130, so that defects are generated in the OS layer 130. Heat treatment performed before the formation of the insulating film 115 can effectively reduce the amount of water and hydrogen contained in the insulating film 113 and the insulating film 114.

Note that when the insulating film 114 is formed over the insulating film 113 while being heated, oxygen can be moved to the OS layer 130 and oxygen vacancies in the OS layer 130 can be reduced. For this reason, the heat treatment is not necessarily performed.

The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

Here, heat treatment is performed at 350° C. for one hour in an atmosphere of nitrogen and oxygen. After that, the insulating film 115 is formed.

In the case where the insulating film 115 is formed by a PECVD method, the substrate temperature is preferably set to higher than or equal to 300° C. and lower than or equal to 400° C., more preferably higher than or equal to 320° C. and lower than or equal to 370° C., so that a dense film can be formed.

In the case where a silicon nitride film is formed by a PECVD method as the insulating film 115, a deposition gas containing silicon, nitrogen, and ammonia are preferably used as a source gas. A small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in a source gas, a flow ratio of the nitrogen to the ammonia is set to be greater than or equal to 5 and less than or equal to 50, or greater than or equal to 10 and less than or equal to 50.

Here, with the use of a PECVD apparatus, a 50-nm-thick silicon nitride film is formed as the insulating film 115 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Through the above steps, the insulating film 113, the insulating film 114, and the insulating film 115 can be formed.

Heat treatment may be performed after the formation of the insulating film 115. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C. When this heat treatment is performed, the amount of hydrogen and water in the insulating film 113 and the insulating film 114 is reduced and accordingly the generation of defects in the OS layer 130 described above is inhibited.

Then, a resist mask RM5 (not shown) is formed over the insulating layer 102 through a photolithography process using a fifth photoresist mask. The insulating layer 102 and the insulating layer 101 are etched using the resist mask RM5, whereby the opening 172 and the opening 173 are formed (FIG. 7A).

After removal of the resist mask RM5, a conductive film is formed over the insulating layer 102. Then, a resist mask RM6 (not shown) is formed over the conductive film through a photolithography process using a sixth photoresist mask. The conductive film is etched using the resist mask RM6, whereby the back gate electrode 150 is formed. After that, the resist mask is removed.

Through the above process, the transistor 11 can be formed with the use of the first to sixth photoresist masks (FIG. 7B). Other transistors of Embodiment 1 can also be formed in a manner similar to that of the transistor 11.

As described above, in this embodiment, a formation process of an OS transistor includes, in order to reduce defects in an OS layer including a channel formation region, a step of forming a film that supplies oxygen to the OS layer and a step of supplying oxygen to the OS layer from the film; thus, a highly reliable OS transistor can be formed.

Embodiment 3

In this embodiment, as an example of a semiconductor device, an active matrix display device including an OS transistor of Embodiment 1 is described.

<Structure Example of Display Device>

Figure 14:
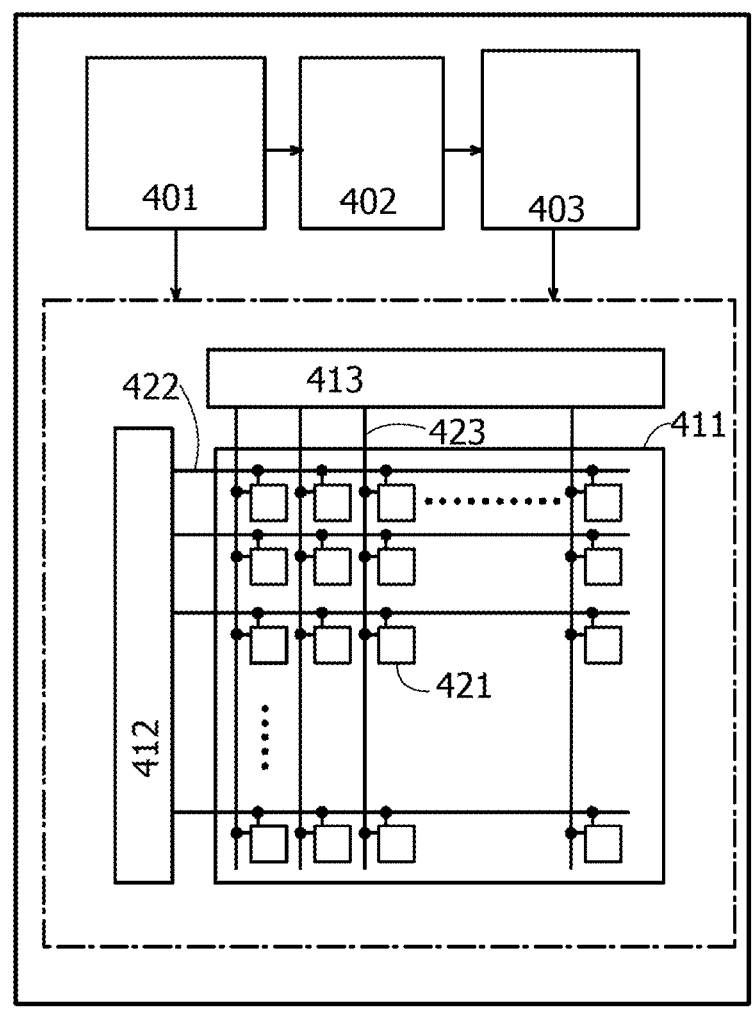
FIG. 14 is a block diagram illustrating an example of a structure of an active matrix display device.
Figure 15:
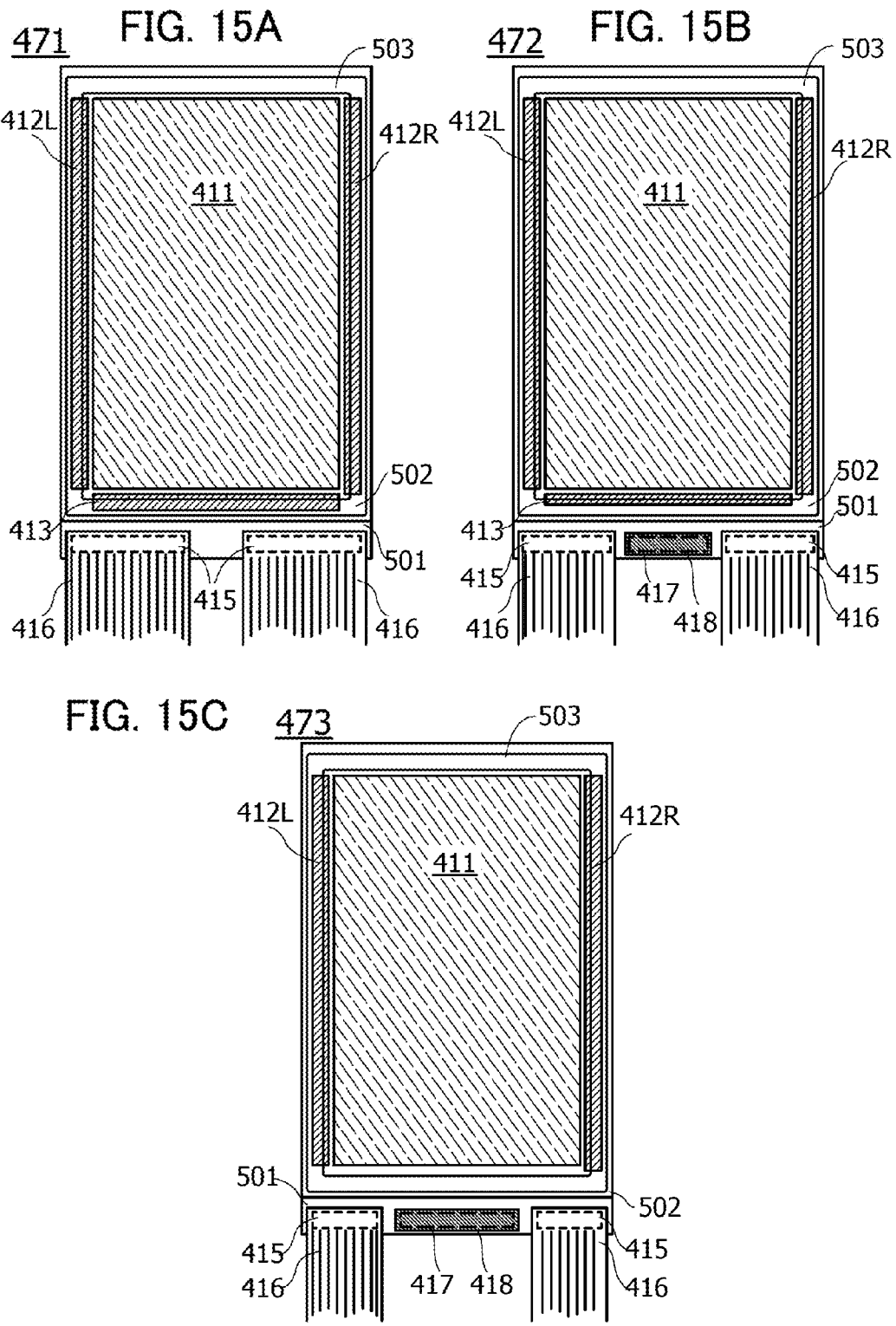
FIGS. 15A to 15C are plan views each illustrating an example of a structure of a display panel.

An active matrix display device is a semiconductor device including a display panel, a controller, a power supply circuit, and the like. FIG. 14 is a block diagram illustrating a structure example of an active matrix liquid crystal display device (LCD). FIGS. 15A to 15C each illustrate a structure example of a liquid crystal panel (LC panel) forming the LCD.

As shown in FIG. 14, a display device 400 includes a controller 401, a power management unit (PMU) 402, a power supply circuit 403, a pixel portion 411, a gate driver circuit 412, and a source driver circuit 413.

The controller 401 controls the display device 400. A video signal, a synchronization signal for controlling rewriting of the screen, and the like are input to the controller 401. Examples of the synchronization signal include a horizontal synchronization signal, a vertical synchronization signal, and a reference clock signal. Control signals of the driver circuits (412 and 413) are generated from these signals. The controller 401 controls the PMU 402. The PMU 402 controls the power supply circuit 403 in accordance with a control signal from the controller 401 or an external device.

The pixel portion 411 includes a plurality of pixels 421 arranged in an array, a plurality of gate lines 422, and a plurality of source lines 423. The pixels 421 in the same row are connected to the gate line 422 in the row, and the pixels 421 in the same column are connected to the source line 423 in the column. The pixel 421 includes a transistor that controls conduction between the pixel 421 and the source line 423. A gate of the transistor is connected to the gate line 422, and the transistor is turned on or off by a signal input to the gate line 422.

The source lines 423 are connected to the source driver circuit 413. The source driver circuit 413 has a function of generating a data signal from a video signal input from the controller 401 and outputting the data signal to the source lines 423. The gate driver circuit 412 has a function of outputting a gate signal to the gate lines 422 in response to a control signal input from the controller 401. The gate signal is a signal for selecting the pixel 421 to which a data signal is to be input. The gate lines 422 are connected to the gate driver circuit 412.

In the case where the pixel portion 411 is formed using OS transistors, the shift register 210 (FIG. 13) including transistors having the same conductivity type described in Embodiment 1 is used for both the driver circuits (412 and 413), so that the pixel portion 411 and the driver circuits (412 and 413) can be integrated on one substrate.

<Structure Example of Display Panel>

FIG. 15A illustrates a structure example of a display panel with a structure in which the pixel portion 411 and the driver circuits (412 and 413) are integrated on one substrate. A display panel 471 includes a substrate 501 and a substrate 502. The pixel portion 411, the driver circuits (412 and 413), and terminal portions 415 are formed over the substrate 501. In FIG. 15A, the gate driver circuit 412 is divided into two gate driver circuits 412R and 412L.

A plurality of terminals for connecting the pixel portion 411 and the driver circuits (412 and 413) to external circuits are formed on the terminal portion 415. The terminal portion 415 is connected to a flexible printed circuit (FPC) 416. Here, a device in which the FPC 416 is not connected to the terminal portion 415 is included in the category of a display panel.

The substrate 501 and the substrate 502 face each other with a space (cell gap) maintained therebetween by a sealant 503. For example, in the case where the display panel is a display panel (liquid crystal panel) of a liquid crystal display device, a liquid crystal layer is sealed between the substrate 501 and the substrate 502 with the sealant 503. The bezel of the display panel 471, which does not contribute to display, can be narrowed by providing the sealant 503 such that the sealant 503 overlaps with the driver circuits (412 and 413) as shown in FIG. 15A.

In the display panel 471, when the pixel portion 411 is formed using a circuit including OS transistors, for example, the driver circuits (412 and 413) are also formed using a circuit including OS transistors. By using FET-1 to FET-3 (FIGS. 1A to 1D to FIGS. 3A to 3D) for these driver circuits (412 and 413), circuits with high drive frequency and low power consumption can be obtained.

In the display panel 471, the circuits (411 to 413) are formed over the substrate 501; the number of components that are provided outside, such as an IC chip, is reduced, leading to a reduction in cost. If circuits are not integrated on the substrate where the pixel portion 411 is provided, wirings would need to be extended and the number of wiring connections would increase. When the driver circuits are provided over the substrate 501, the number of wiring connections can be reduced. Consequently, the reliability or yield can be improved.

Note that it is also possible to form part or whole of the source driver circuit 413 using a CMOS circuit including Si transistors. In that case, part of the circuits of the source driver circuit 413 may be packaged on an IC chip and the IC chip may be mounted on the substrate 501.

Display panels having such structure examples are shown in FIGS. 15B and 15C. In a display panel 472 shown in FIG. 15B, an IC chip serving as part of the source driver circuit 413 is mounted on a tape carrier package (TCP) 418. In a display panel 473 shown in FIG. 15C, an IC chip on the TCP 418 includes all the circuits of the source driver circuit 413. Note that an FPC connected to the IC chip is not illustrated in the TCP 418. Here, a terminal portion 417 connected to the TCP 418 is formed over the substrate 501. A plurality of terminals for connecting source lines of the pixel portion 411 to the TCP 418 are formed in the terminal portion 417. Note that a structure without the TCP 418 is also regarded as one of structure examples of the display panel of this embodiment.

Moreover, in the case where some circuits of the source driver circuit 413 are formed with transistors of the same conductivity type as the transistors of the pixel portion 411 and the gate driver circuit 412, such circuits may be formed over the substrate 501 and other circuits may be incorporated in an IC chip.

There is no particular limitation on a method for mounting the IC chip. A method of providing a bare chip directly on the substrate 501 (chip on glass (COG)) may be employed. Alternatively, instead of TCP, a system on film (SOF), which incorporates an IC chip, may be attached to the substrate 501.

<Structure of Display Device>

Figure 16:
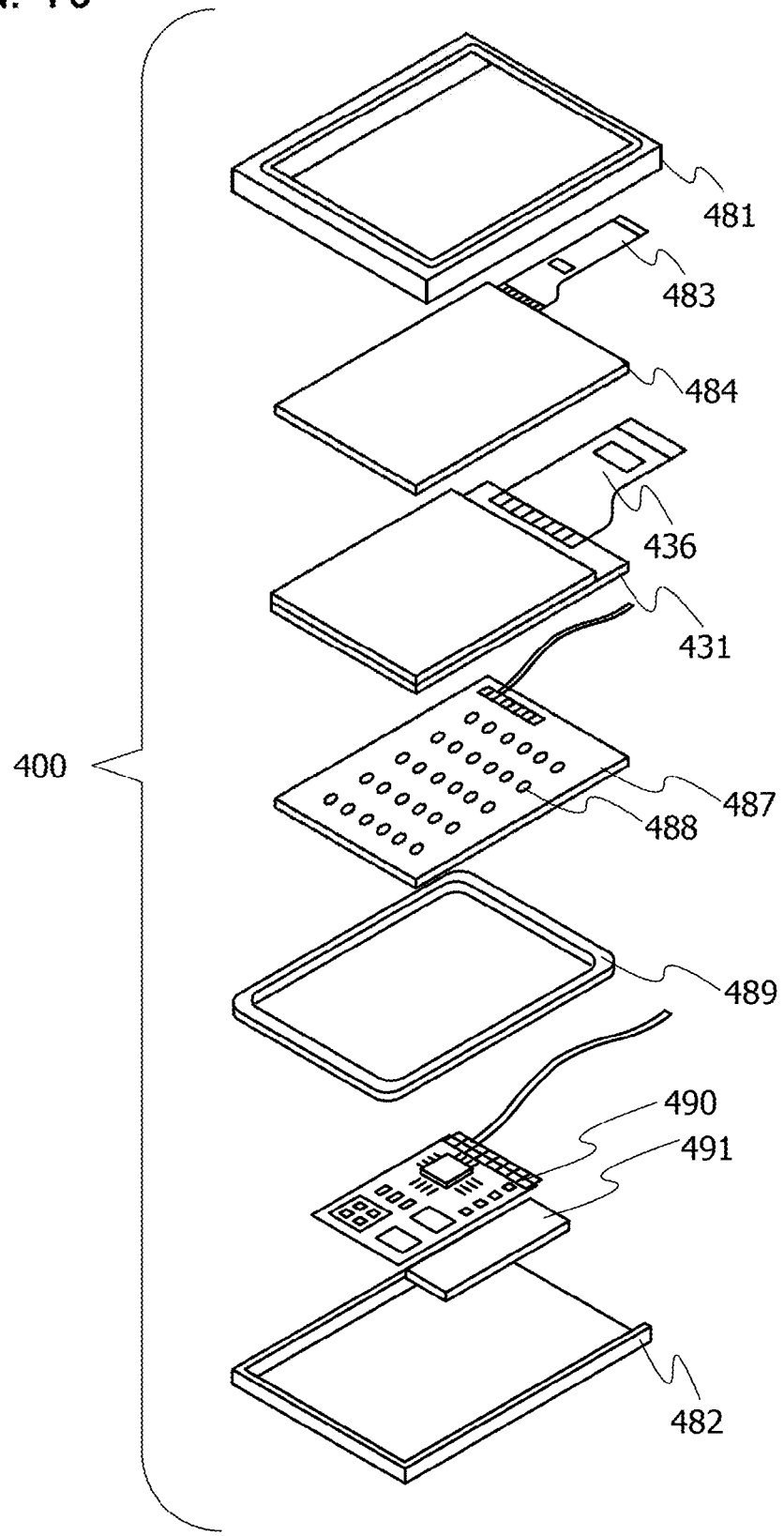
FIG. 16 is an exploded perspective view illustrating an example of a structure of an active matrix display device.

A structure of a display device is described as an example of the display device 400 with reference to FIG. 16. FIG. 16 is an exploded perspective view of the display device.

As shown in FIG. 16, in the display device 400, a touch panel unit 484 connected to an FPC 483, the display panel 471 connected to an FPC 485, a backlight unit 487, a frame 489, a printed board 490, and a battery 491 are provided between an upper cover 481 and a lower cover 482. Note that the backlight unit 487, the battery 491, the touch panel unit 484, and the like are not provided in some cases. For example, in the case where the display device 400 is a reflective liquid crystal display device or an electroluminescent (EL) display device, the backlight unit 487 is unnecessary.

The shapes and sizes of the upper cover 481 and the lower cover 482 can be changed as appropriate in accordance with the sizes of the touch panel unit 484 and the display panel 471.

The touch panel unit 484 can be a resistive touch panel or a capacitive touch panel and may be formed so as to overlap with the display panel 471. A counter substrate (sealing substrate) of the display panel 471 can have a touch panel function. A photosensor may be provided in each pixel of the display panel 471 so that an optical touch panel is obtained. An electrode for a touch sensor may be provided in each pixel of the display panel 471 so that a capacitive touch panel is obtained.

The backlight unit 487 includes a light source 488. The light source 488 may be provided at an end portion of the backlight unit 487 and a light diffusing plate may be used.

The frame 489 protects the display panel 471 and also functions as an electromagnetic shield for blocking electromagnetic waves generated by the operation of the printed board 490. The frame 489 may function as a radiator plate.

The printed board 490 is provided with a power supply circuit and a signal processing circuit for outputting a video signal and a clock signal. As a power source for supplying power to the power supply circuit, an external commercial power source or a power source using the battery 491 provided separately may be used. The battery 491 can be omitted in the case of using a commercial power source.

The display device 400 may be additionally provided with a member such as a polarizing plate, a retardation plate, or a prism sheet. FIG. 16 illustrates an example where the display panel 471 in FIG. 15A is used; however, a display panel with another structure (e.g., display panels 472 and 473) may be used.

<Pixel of Liquid Crystal Display Device (LCD)>

Figure 17A:
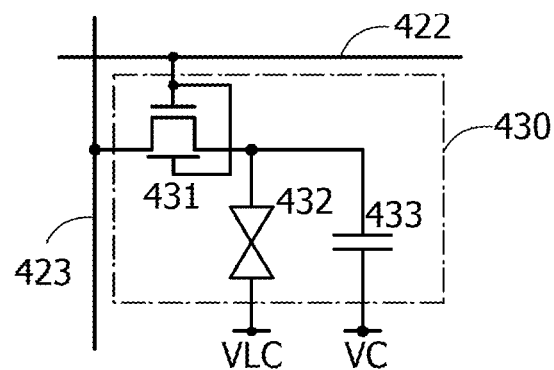
FIGS. 17A and 17B are circuit diagrams each illustrating an example of a configuration of a pixel.

FIG. 17A is a circuit diagram illustrating a structure example of a pixel of an LCD. A pixel 430 includes a transistor 431, a liquid crystal element 432, and a capacitor 433.

The liquid crystal element 432 includes two electrodes and a liquid crystal layer between the two electrodes. A pixel electrode formed over the substrate 501 forms one electrode of the liquid crystal element 432, and is connected to the transistor 431. A voltage VLC is input to the other electrode of the liquid crystal element 432. The transistor 431 functions as a switch that controls conduction between the liquid crystal element 432 (pixel electrode) and the source line 423. A gate of the transistor 431 is connected to the gate line 422. Here, FET-1 (FIGS. 1A to 1D) is used as the transistor 431. The capacitor 433 functions as a storage capacitor that holds voltage between the two electrodes of the liquid crystal element 432.

When the transistor 431 is turned on, the liquid crystal element 432 and the capacitor 433 are charged or discharged depending on the potential of the source line 423. Depending on the voltage held in the liquid crystal element 432 and the capacitor 433, the alignment state of the liquid crystal layer changes, resulting in a change in transmittance of the liquid crystal element 432.

Note that a display device other than an LCD can be obtained by changing the circuit structure of the pixel. For example, when electronic paper is to be provided, the liquid crystal element 432 in FIG. 17A may be replaced with a display element that controls a gray level by an electronic liquid powder method or the like.

<Pixel of EL Display Device>

Figure 17B:
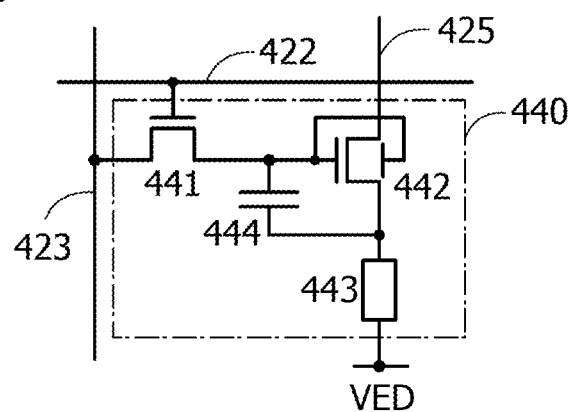

In the case where the display device 400 is an EL display device, a pixel 440 in FIG. 17B may be provided in the pixel portion 411. The pixel 440 includes a transistor 441, a transistor 442, an EL element 443, and a capacitor 444. Here, the transistors 441 and 442 have the same conductivity type.

The transistor 441 is a switch transistor that controls conduction between the pixel 440 and the source line 423. The transistor 442, which is called a driver transistor, has the device structure of FET-1.

The EL element 443 is a light-emitting element including two electrodes (an anode and a cathode) and a light-emitting layer containing an organic compound between the two electrodes. One electrode of the EL element 443 is connected to a wiring 425 to which a constant potential is input. The light-emitting layer includes at least a light-emitting substance. Examples of the light-emitting substance include organic EL materials, inorganic EL materials, and the like. Light emission from the light-emitting layer includes light emission (fluorescence) which is generated in returning from a singlet excited state to a ground state and light emission (phosphorescence) which is generated in returning from a triplet excited state to a ground state.

The EL element 443 is capable of changing emission intensity in accordance with current that flows between the two electrodes. Here, the emission intensity of the EL element 443 is adjusted by the value of current flowing through the transistor 442. That is, the emission intensity of the EL element 443 is adjusted by a gate voltage of the transistor 442.

The capacitor 444 is connected between a gate of the transistor 442 and the wiring 425. The capacitor 444 functions as a storage capacitor that holds the gate voltage of the transistor 442. When the transistor 441 is turned on, current based on the potential of a source signal input to the source line 423 flows in the transistor 441. The gate of the transistor 442 is charged or discharged depending on this current, so that its potential is adjusted.

Note that the circuit structure of a pixel is not limited to those in FIGS. 17A and 17B. For example, a switch, a resistor, a capacitor, a sensor, a transistor, a logic circuit, or the like may be added to the pixels in FIGS. 17A and 17B.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

<Device Structure of Pixel of Display Device>

A device structure of a pixel of an active matrix display device is described below with reference to FIG. 18 and FIG. 19. Here, a device structure of the pixel portion 411 is described as an example. The structure of the pixel portion 411 including the pixel 430 in FIG. 17A is described as an example.

Figure 18:
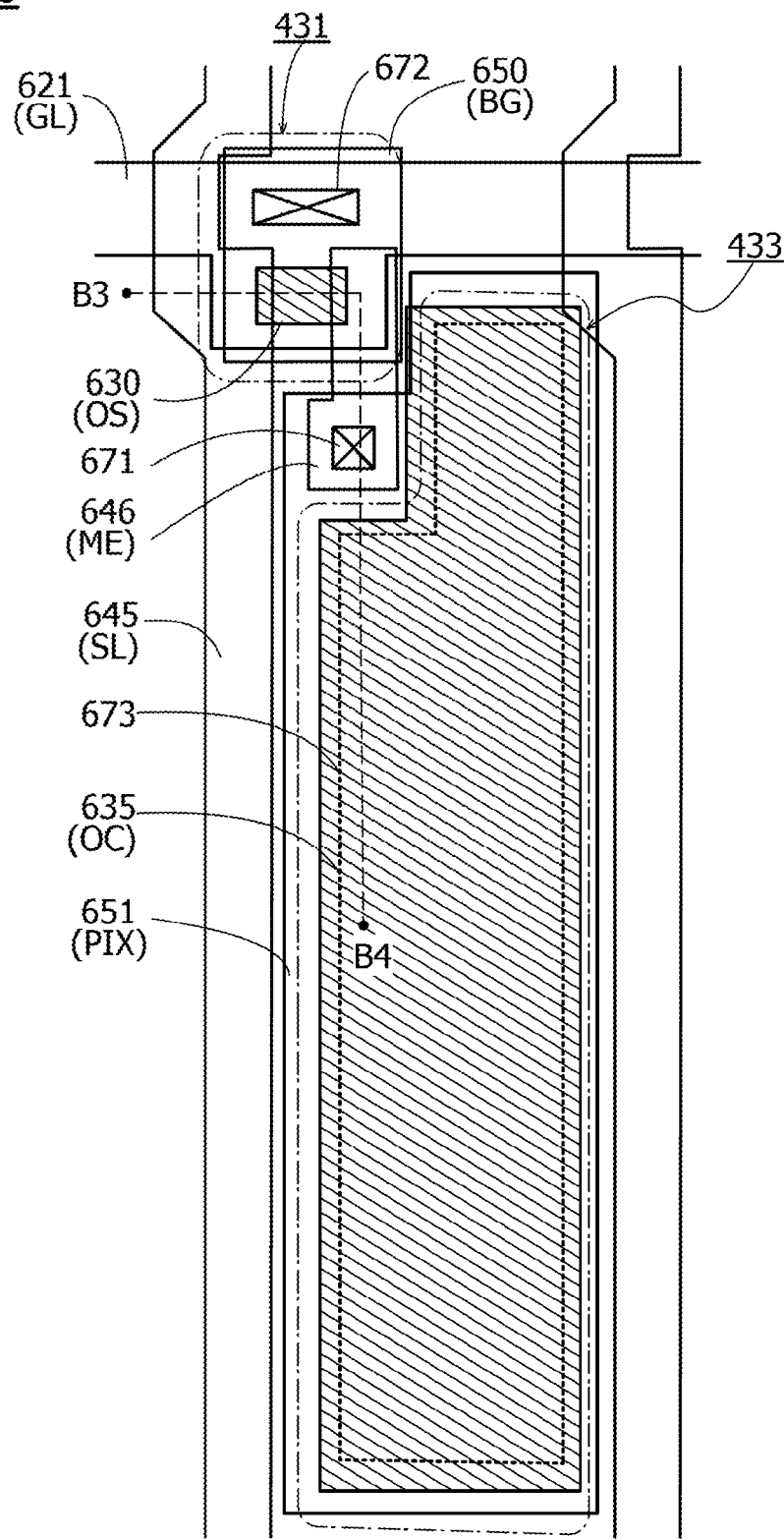
FIG. 18 is a plan view illustrating a structure example of a pixel portion.

FIG. 18 is a top view of the pixel portion 411 (the pixel 430) and corresponds to the planar layout of the transistor 431 and the like. FIG. 19 is a cross-sectional view taken along line B3-B4 in FIG. 18 and corresponds to a cross-sectional view of the display panel 471.

The pixel 430 includes a color filter substrate and a backplane in which the circuits (411 to 413) formed using an oxide semiconductor film are provided. A support substrate of the backplane is the substrate 501, and a support substrate of the color filter substrate is the substrate 502. A substrate that transmits visible light is used as each of the substrates 501 and 502; for example, a glass substrate or a flexible substrate made of a resin or the like is used. In the case where a flexible substrate is used, the backplane is formed first, a support substrate used for the formation is separated, and then the flexible substrate is fixed.

FIG. 18 illustrates the planar layout of the pixel 430 on the backplane side. This backplane is formed in a process similar to the formation process of an OS transistor using the first to sixth photoresist masks, which is described in Embodiment 2. Therefore, Embodiment 2 can be referred to for the method for forming the backplane. Together with the pixel portion 411, the driver circuits (412 and 413) are formed using an oxide semiconductor film over the substrate 501.

A liquid crystal layer 520 is sealed between the substrate 501 and the substrate 502 with the sealant 503 (FIG. 15A). A shielding film 541 blocking visible light and a coloring layer 542 transmitting visible light in a specific wavelength range are provided on the substrate 502. A resin film 543 is provided on the shielding film 541 and the coloring layer 542, and an electrode 652 is provided on the resin film 543. The electrode 652, which is called a common electrode, forms an electrode of the liquid crystal element 432. An alignment film 532 is formed to cover the electrode 652.

The pixel portion 411 includes a wiring (GL) 621, a wiring (SL) 645, an electrode (ME) 646, a back gate electrode (BG) 650, and an oxide semiconductor layer (OS) 630. These components form the transistor 431. The wiring (GL) 621, which corresponds to the gate line 422, includes a region serving as a front gate electrode of the transistor 431. The wiring (SL) 645, which corresponds to the source line 423, includes a region serving as a source electrode of the transistor 431. The electrode (ME) 646 forms a drain electrode of the transistor 431. Note that FIG. 19 illustrates a cross-sectional structure of the transistor 431 in the channel length direction.

In the pixel portion 411, a metal oxide layer (OC) 635 and a pixel electrode (PIX) 651 are formed. The metal oxide layer 635 and the pixel electrode 651 form a pair of electrodes of the capacitor 433. In addition, the pixel electrode 651 forms an electrode of the liquid crystal element 432. A region where the pixel electrode 651 and the electrode 652 face each other with the liquid crystal layer 520 positioned therebetween functions as the liquid crystal element 432 (FIG. 19).

Figure 19:
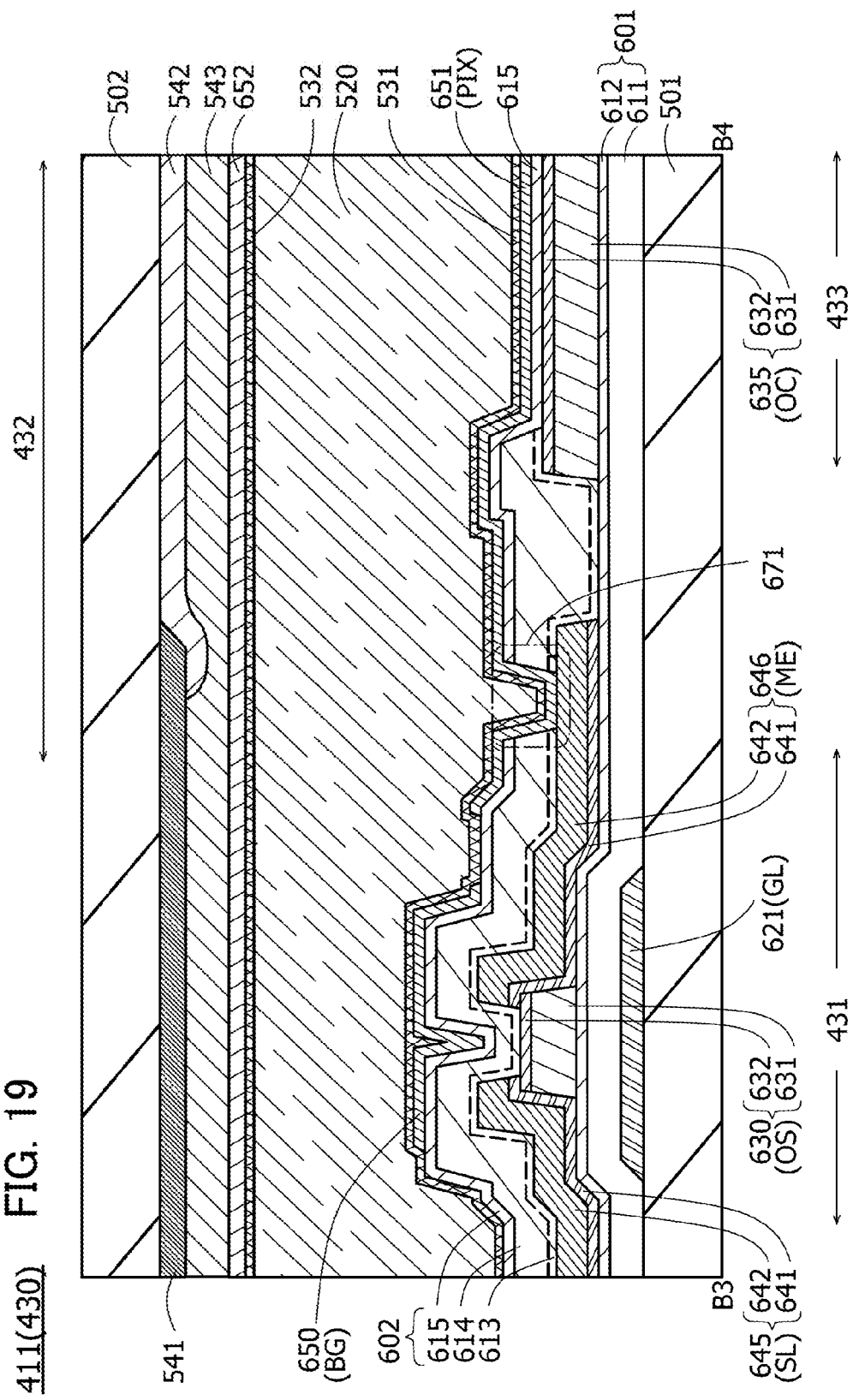
FIG. 19 is a cross-sectional view illustrating a structure example of a pixel portion.

As shown in FIG. 19, an insulating layer 601 is formed to cover the wiring 621, and the oxide semiconductor layer 630 and the metal oxide layer 635 are formed over the insulating layer 601. The insulating layer 601 is a stack of an insulating film 611 and an insulating film 612. The oxide semiconductor layer 630 and the metal oxide layer 635 are each a stack of a metal oxide film 631 and a metal oxide film 632. In the oxide semiconductor layer 630, the metal oxide film 631 is an oxide semiconductor film in which a channel is formed. The wiring (SL) 645 is in contact with one of a pair of opposite side surfaces of the oxide semiconductor layer 630, and the electrode (ME) 646 is in contact with the other.

An insulating layer 602 is formed to cover the oxide semiconductor layer 630, the metal oxide layer 635, the wiring 645, and the electrode 646. The back gate electrode 650 and the pixel electrode 651 are formed over the insulating layer 602. An alignment film 531 is formed to cover the back gate electrode 650 and the pixel electrode 651.

The insulating layer 602 has a stacked-layer structure of insulating films 613 to 615. An opening 671 reaching the electrode 646 is formed in the insulating layer 602. The pixel electrode 651 is in contact with the electrode 646 in the opening 671. In addition, an opening 672 (FIG. 18) reaching the wiring 621 is formed in the insulating layer 602 and the insulating layer 601. The back gate electrode 650 is in contact with the wiring 621 in the opening 672. Note that as in FIG. 1A, two openings may be provided to connect the back gate electrode 650 to the wiring 621.

An opening 673 is formed in a stacked film of the insulating film 613 and the insulating film 614 of the insulating layer 602. In the opening 673, a region where the metal oxide layer 635 and the pixel electrode 651 face each other with the insulating film 615 positioned therebetween functions as the capacitor 433. In this case, the opening 673 is formed after the insulating films 613 and 614 are formed in succession. Then, the insulating film 615 is formed using a nitride insulator. The metal oxide layer 635 can be used as an electrode of the capacitor 433 probably because, for example, oxygen vacancies are formed in the metal oxide layer 635 at the time of forming the opening 673 or the insulating film (nitride insulating film) 615, and hydrogen diffused from the insulating film 615 is bonded to the oxygen vacancies to form a donor. Specifically, the resistivity of the metal oxide layer 635 is higher than or equal to $1 \times 10^{-3}$ Ω·cm and lower than $1 \times 10^4$ Ω·cm, preferably higher than or equal to $1 \times 10^{-3}$ Ω·cm and lower than $1 \times 10^{-1}$ Ω·cm.

It is preferable that the metal oxide layer 635 have a higher hydrogen concentration than the oxide semiconductor layer 630. In the metal oxide layer 635, the hydrogen concentration measured by SIMS is greater than or equal to $8 \times 10^{19}$ atoms/cm$^3$, preferably greater than or equal to $1 \times 10^{20}$ atoms/cm$^3$, more preferably greater than or equal to $5 \times 10^{20}$ atoms/cm$^3$. In the oxide semiconductor layer 630, the hydrogen concentration measured by SIMS is less than $5 \times 10^{19}$ atoms/cm$^3$, preferably less than $5 \times 10^{18}$ atoms/cm$^3$, more preferably less than or equal to $1 \times 10^{18}$ atoms/cm$^3$, still more preferably less than or equal to $5 \times 10^{17}$ atoms/cm$^3$, further preferably less than or equal to $1 \times 10^{16}$ atoms/cm$^3$.

Although FIG. 18 and FIG. 19 illustrate a structure example of a pixel driven in a twisted nematic (TN) mode, one embodiment of the present invention is not limited thereto. It is also possible to use a pixel driven in any of the following modes: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

The liquid crystal layer 520 can be formed using, for example, a liquid crystal material categorized as a thermotropic liquid crystal or a lyotropic liquid crystal. Alternatively, the liquid crystal layer 520 can be formed using, for example, a liquid crystal material categorized as a nematic liquid crystal, a smectic liquid crystal, a cholesteric liquid crystal, or a discotic liquid crystal. Alternatively, the liquid crystal layer 520 can be formed using, for example, a liquid crystal material categorized as a ferroelectric liquid crystal or an anti-ferroelectric liquid crystal. Alternatively, the liquid crystal layer 520 can be formed using, for example, a liquid crystal material categorized as a high-molecular liquid crystal such as a main-chain high-molecular liquid crystal, a side-chain high-molecular liquid crystal, or a composite-type high-molecular liquid crystal, or a low-molecular liquid crystal. Alternatively, the liquid crystal layer 520 can be formed using, for example, a liquid crystal material categorized as a polymer dispersed liquid crystal (PDLC).

Alternatively, in the case of not using an alignment film, liquid crystal exhibiting a blue phase may be used for the liquid crystal layer 520. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. The liquid crystal composition which includes a liquid crystal exhibiting a blue phase and a chiral material is preferable because it has a small response time of less than or equal to 1 msec, has optical isotropy, which makes the alignment process unneeded, and has a small viewing angle dependence.

Although a liquid crystal display device using a color filter to display a color image is described as an example here, a color display method is not limited thereto. For example, the liquid crystal display device may display a color image by sequentially lighting a plurality of light sources having different hues.

Embodiment 4

In this embodiment, an oxide semiconductor film used for an OS layer of an OS transistor is described.

<Structure of Oxide Semiconductor Film>

The structure of the OS layer of the OS transistor is described below. In the description of a crystal structure, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly includes the case where the angle is greater than or equal to 85° and less than or equal to 95°. In addition, the term "substantially perpendicular" indicates that the angle formed between two straight lines is greater than or equal to 60° and less than or equal to 120°.

The OS layer may be formed using a single-crystal oxide semiconductor film or a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films having a plurality of crystal parts.

<CAAC-OS Film>

When a combined analysis image (also referred to as a high-resolution TEM image) of a bright-field image and a diffraction pattern of the CAAC-OS film is observed by a transmission electron microscope (TEM), a plurality of crystal parts are seen. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 22A:
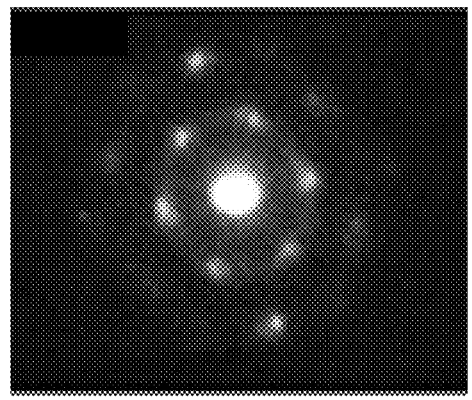
FIGS. 22A and 22B show nanobeam electron diffraction patterns of oxide semiconductor films.

Note that in an electron diffraction pattern of the CAAC-OS film, spots (bright spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (FIG. 22A).

From the results of the high-resolution cross-sectional TEM image and the high-resolution planar TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 nm$^2$, larger than or equal to 5 μm$^2$, or larger than or equal to 1000 μm$^2$ is observed in some cases in the high-resolution planar TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is trapped therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Accordingly, the transistor which includes the oxide semiconductor film having a high impurity concentration and a high density of defect states can have unstable electrical characteristics.

In an OS transistor including the CAAC-OS film, changes in electrical characteristics of the transistor due to irradiation with visible light or ultraviolet light are small. Thus, the transistor has high reliability.

For example, a CAAC-OS film is deposited by sputtering with a polycrystalline metal oxide target. When ions collide with the target, a crystal region included in the target might be separated from the target along the a-b plane, and a sputtered particle having a plane parallel to the a-b plane (flat-plate-like or pellet-like sputtered particle) might be separated from the target. In that case, the flat-plate-like or pellet-like sputtered particle reaches a substrate while maintaining its crystal state, so that the CAAC-OS film can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced.

Specifically, a deposition gas whose dew point is −80° C. or lower, preferably −100° C. or lower is used.

By increasing the substrate heating temperature during the deposition, when the flat-plate-like or pellet-like sputtered particle reaches the substrate, migration occurs on the substrate, so that a flat plane of the sputtered particle is attached to the substrate. For example, the substrate heating temperature during the deposition is higher than or equal to 100° C. and lower than or equal to 740° C., preferably higher than or equal to 200° C. and lower than or equal to 500° C.

Furthermore, it is possible to reduce plasma damage during the deposition by increasing the proportion of oxygen in the deposition gas and optimizing power. For example, the proportion of oxygen in the deposition gas is higher than or equal to 30 vol %, preferably 100 vol %.

<Microcrystalline Oxide Semiconductor Film>

Next, a microcrystalline oxide semiconductor film is described.

In the high-resolution TEM image of the microcrystalline oxide semiconductor film, there are a region where a crystal part is clearly observed and a region where a crystal part is not observed. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in the nc-OS film in some cases.

Figure 22B:
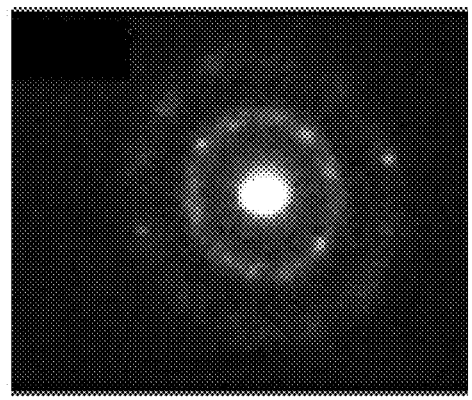

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (FIG. 22B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film.

Therefore, the nc-OS film has a higher density of defect states than the CAAC-OS film.

<Amorphous Oxide Semiconductor Film>

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 23A:
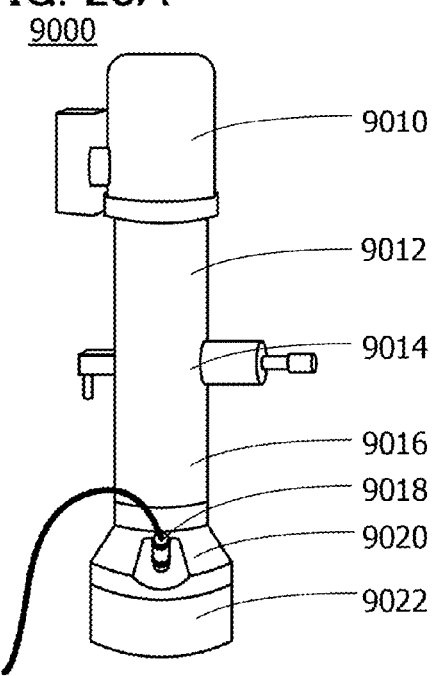
FIGS. 23A and 23B illustrate an example of a transmission electron diffraction measurement apparatus.
Figure 23B:
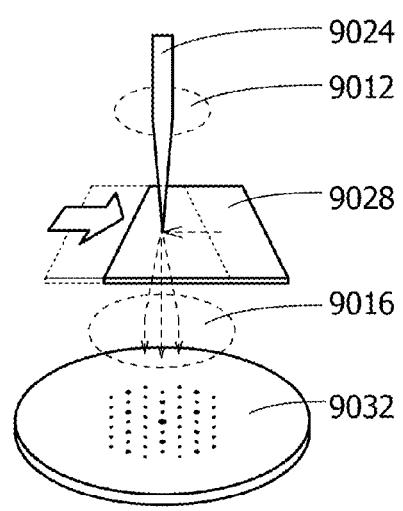

FIGS. 23A and 23B illustrate an example of a transmission electron diffraction measurement apparatus. FIG. 23A illustrates the appearance of the transmission electron diffraction measurement apparatus, and FIG. 23B illustrates the inner structure thereof.

A transmission electron diffraction measurement apparatus 9000 includes an electron gun chamber 9010, an optical system 9012, a sample chamber 9014, an optical system 9016, an observation chamber 9020, and a film chamber 9022. A camera 9018 and a fluorescent screen 9032 are provided in the observation chamber 9020. The camera 9018 is installed so as to face the fluorescent screen 9032. Note that the film chamber 9022 is not necessarily provided.

In the transmission electron diffraction measurement apparatus 9000, a substance 9028 which is positioned in the sample chamber 9014 is irradiated with electrons emitted from an electron gun installed in the electron gun chamber 9010 through the optical system 9012. Electrons passing through the substance 9028 enter the fluorescent screen 9032 through the optical system 9016. On the fluorescent screen 9032, a pattern corresponding to the intensity of the incident electron appears, which allows measurement of a transmission electron diffraction pattern.

The camera 9018 is installed so as to face the fluorescent screen 9032 and can take a picture of a pattern appearing in the fluorescent screen 9032. An angle formed by a straight line which passes through the center of a lens of the camera 9018 and the center of the fluorescent screen 9032 and an upper surface of the fluorescent screen 9032 is, for example, 15° or more and 80° or less, 30° or more and 75° or less, or 45° or more and 70° or less. As the angle is reduced, distortion of the transmission electron diffraction pattern taken by the camera 9018 becomes larger. Note that if the angle is obtained in advance, the distortion of an obtained transmission electron diffraction pattern can be corrected.

Note that the film chamber 9022 may be provided with the camera 9018. For example, the camera 9018 may be set in the film chamber 9022 so as to be opposite to the incident direction of electrons 9024. In this case, a transmission electron diffraction pattern with less distortion can be taken from the rear surface of the fluorescent screen 9032.

A holder for fixing the substance 9028 which is a sample is provided in the sample chamber 9014. The holder transmits electrons passing through the substance 9028. The holder may have, for example, a function of moving the substance 9028 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 9028.

Then, a method for measuring a transmission electron diffraction pattern of a substance by the transmission electron diffraction measurement apparatus 9000 is described.

For example, changes in the structure of the substance 9028 can be observed by changing (scanning) the irradiation position of the electrons 9024 that are a nanobeam in the substance 9028, as illustrated in FIG. 23B. At this time, when the substance 9028 is a CAAC-OS film, a diffraction pattern shown in FIG. 22A is observed. When the substance 9028 is an nc-OS film, a diffraction pattern shown in FIG. 22B is observed.

Even when the substance 9028 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 60%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

As an example, transmission electron diffraction patterns were obtained by scanning the top surfaces of three samples: a sample including a CAAC-OS film just after deposition (referred to as as-depo), a sample including a CAAC-OS film subjected to heat treatment at 350° C., and a sample including a CAAC-OS film subjected to heat treatment at 450° C. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used.

Figure 24:
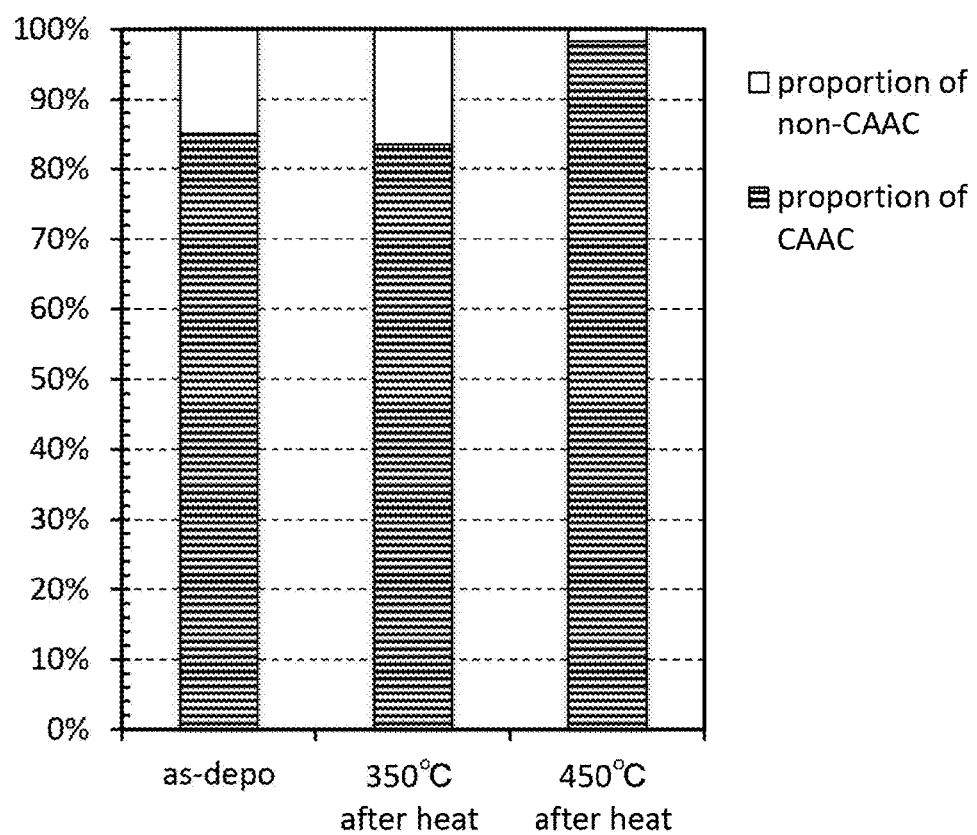
FIG. 24 is a graph showing an example of a structure analysis by transmission electron diffraction measurement.

FIG. 24 shows the proportion of CAAC in each sample. These results show that the proportion of CAAC obtained after the heat treatment at 450° C. is higher than that obtained just after the deposition or after the heat treatment at 350° C. That is, heat treatment at a temperature higher than 350° C. (e.g., higher than or equal to 400° C.) reduces the proportion of non-CAAC (increases the proportion of CAAC).

Here, most of diffraction patterns different from that of a CAAC-OS film are diffraction patterns similar to that of an nc-OS film. According to the results, by heat treatment, a region having a structure similar to an nc-OS film is influenced by the structure of an adjacent region, and becomes a CAAC region. With such a measurement method, the structure of an oxide semiconductor film having a plurality of structures can be analyzed in some cases.

Embodiment 5

A variety of electronic devices can be formed using a transistor of one embodiment of the present invention. For example, the transistor can be used for electronic devices such as display devices, personal computers, or image reproducing devices provided with recording media (typically, devices which reproduce the content of recording media such as digital versatile discs (DVDs) and have displays for displaying the reproduced images). Other examples of the electronic devices to which the transistor of one embodiment of the present invention can be applied include cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. FIGS. 20A to 20F illustrate specific examples of these electronic devices.

Figure 20A:
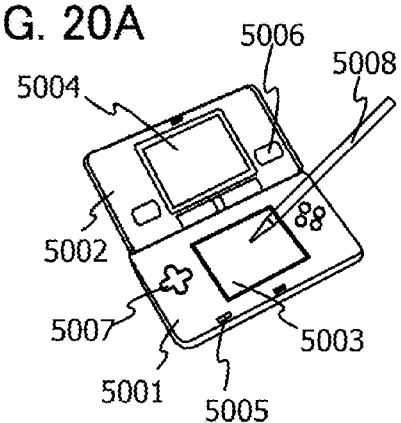
FIGS. 20A to 20F each illustrate an example of a structure of an electronic device.

FIG. 20A illustrates a portable game machine including a housing 5001, a housing 5002, a display portion 5003, a display portion 5004, a microphone 5005, speakers 5006, operation keys 5007, a stylus 5008, and the like. The transistor of one embodiment of the present invention can be used for the display portion 5003, the display portion 5004, or an integrated circuit in another portion. Note that although the portable game machine in FIG. 20A has the two display portions 5003 and 5004, the number of display portions included in the portable game machine is not limited thereto.

Figure 20B:
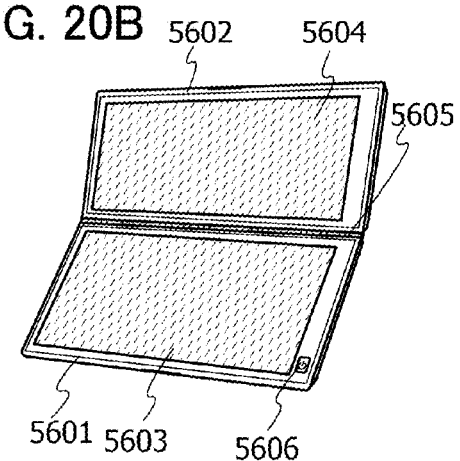

FIG. 20B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. The transistor of one embodiment of the present invention can be used for the first display portion 5603, the second display portion 5604, or an integrated circuit in another portion.

Figure 20C:
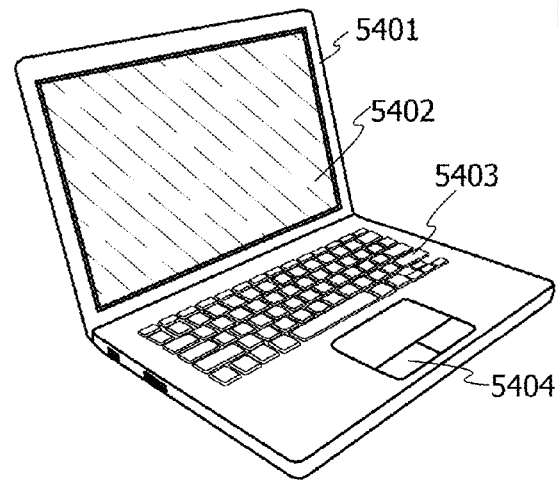

FIG. 20C illustrates a laptop personal computer, which includes a housing 5401, a display portion 5402, a keyboard 5403, a pointing device 5404, and the like. The transistor of one embodiment of the present invention can be used for the display portion 5402 or an integrated circuit in another portion.

Figure 20D:
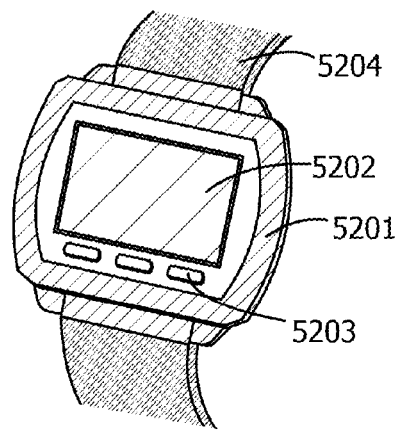

FIG. 20D illustrates a wristwatch, which includes a housing 5201, a display portion 5202, an operation button 5203, a bracelet 5204, and the like. The transistor of one embodiment of the present invention can be used for the display portion 5202 or an integrated circuit in another portion.

Figure 20E:
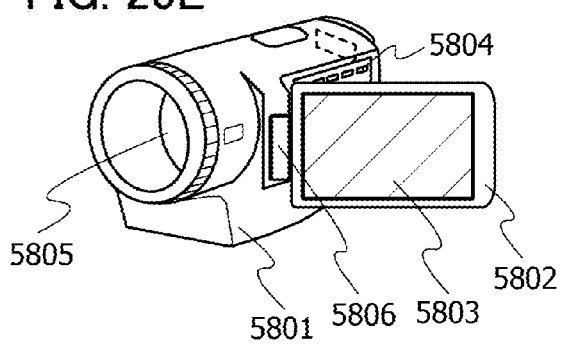

FIG. 20E illustrates a video camera including a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images on the display portion 5803 may be switched in accordance with the angle at the joint 5806 between the first housing 5801 and the second housing 5802.

The transistor of one embodiment of the present invention can be used for the display portion 5803 or an integrated circuit in another portion.

Figure 20F:
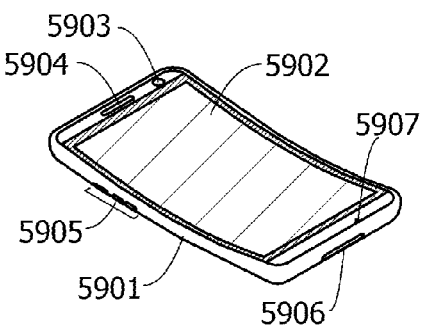

FIG. 20F illustrates a cellular phone. In the cellular phone, a display portion 5902, a microphone 5907, a speaker 5904, a camera 5903, an external connection portion 5906, and an operation button 5905 are provided in a housing 5901. The transistor of one embodiment of the present invention can be used for the display portion 5902 or an integrated circuit in another portion. When the transistor of one embodiment of the present invention is provided over a flexible substrate, the transistor can be used as the display portion 5902 having a curved surface, as illustrated in FIG. 20F.

A transistor of one embodiment of the present invention can be combined with a Si transistor formed using a single crystal silicon wafer, whereby a variety of semiconductor devices can be provided. For example, a memory, a CPU, a microcontroller, a programmable device such as FPGA, and an RFID tag can be provided. Here, usage examples of RFID tags are described.

Figure 21A:
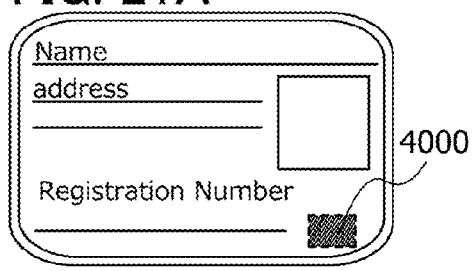
FIGS. 21A to 21F illustrate usage examples of an RFID tag.
Figure 21B:
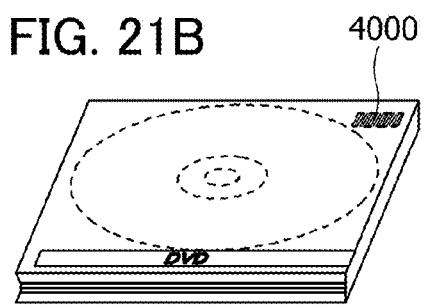
Figure 21C:
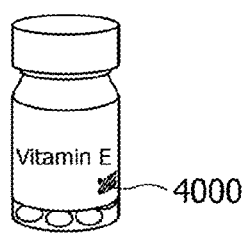
Figure 21D:
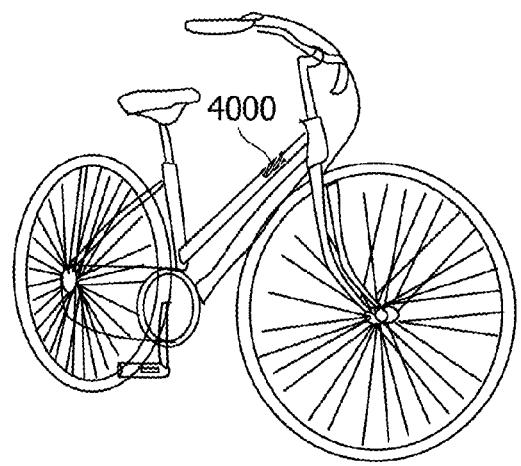
Figure 21E:
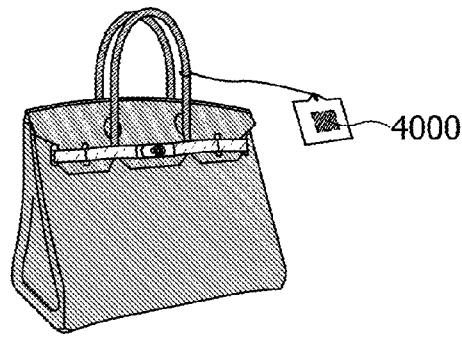
Figure 21F:
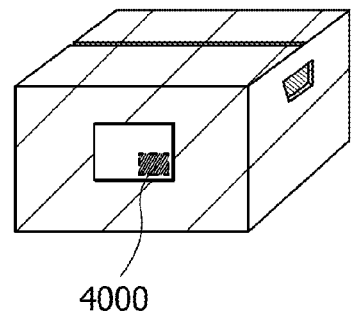

RFID tags can be used in a wide range of fields. For example, they can be provided in objects such as bills, coins, securities, bearer bonds, documents (e.g., driver's licenses or resident's cards, see FIG. 21A), packaging containers (e.g., wrapping paper or bottles, see FIG. 21C), recording media (e.g., DVD software or video tapes, see FIG. 21B), vehicles (e.g., bicycles, see FIG. 21D), personal belongings (e.g., bags or glasses), foods, plants, animals, human bodies, clothing, household goods, medical supplies such as medicine and chemicals, and electronic devices (e.g., liquid crystal display devices, EL display devices, smart phones, cellular phones, clocks, or watches), or tags on objects (see FIGS. 21E and 21F).

An RFID tag 4000 is fixed to an object by being attached to a surface of the object or embedded in the object. For example, the RFID tag 4000 is fixed to each object by being embedded in paper of a book, or embedded in an organic resin of a package. Since the RFID tag 4000 can be reduced in size, thickness, and weight, it can be fixed to an object without spoiling the design of the object. When the RFID tag 4000 is provided in bills, coins, securities, bearer bonds, documents, or the like, an authentication function can be provided to the objects. The use of the authentication function can prevent forgery. Further, when the RFID tag 4000 is attached to packaging containers, recording media, personal belongings, foods, clothing, household goods, electronic devices, or the like, a system such as an inspection system or an inventory management system can be used efficiently. When the RFID tag 4000 is attached to vehicles, the level of security can be raised.

This application is based on Japanese Patent Application serial no. 2013-191185 filed with Japan Patent Office on Sep. 13, 2013 and Japanese Patent Application serial no. 2013-191187 filed with Japan Patent Office on Sep. 13, 2013, the entire contents of which are hereby incorporated by reference.

What is claimed is:

1. A semiconductor device comprising:
   a transistor comprising:
   an oxide semiconductor layer including a channel formation region;
   a first gate electrode and a second gate electrode;
   a first insulating layer and a second insulating layer;
   a source electrode; and
   a drain electrode,
   wherein the first gate electrode faces the oxide semiconductor layer with the first insulating layer interposed therebetween,
   wherein the second gate electrode faces the oxide semiconductor layer with the second insulating layer interposed therebetween,
   wherein the second gate electrode is longer than the oxide semiconductor layer in a channel length direction,
   wherein the second gate electrode is in contact with the first gate electrode in at least one opening in the first insulating layer and the second insulating layer, and
   wherein the oxide semiconductor layer comprises:
   a first side surface in contact with the source electrode and a second side surface in contact with the drain electrode; and
   at least one third side surface facing the second gate electrode with the second insulating layer interposed therebetween and without the source electrode and the drain electrode interposed therebetween.

2. The semiconductor device according to claim 1, wherein a channel length of the transistor is greater than or equal to 0.5 μm and less than or equal to 2 μm.

3. The semiconductor device according to claim 1,
   wherein the oxide semiconductor layer comprises at least an oxide semiconductor film and a metal oxide film over and in contact with the oxide semiconductor film,
   wherein the oxide semiconductor film includes the channel formation region and has a thickness of greater than or equal to 100 nm, and
   wherein the metal oxide film has a thickness of greater than or equal to 50 nm.

4. The semiconductor device according to claim 3,
   wherein the oxide semiconductor film comprises an In—Ga—Zn oxide, and
   wherein the metal oxide film comprises an In—Ga oxide.

5. A semiconductor device comprising:
   an inverter circuit comprising:
   an input terminal;
   an output terminal; and
   a first transistor which is the transistor according to claim 1 and a second transistor which is connected in series,
   wherein in the first transistor, the first gate electrode is connected to the input terminal and the drain electrode is connected to the output terminal, and
   wherein in the second transistor, the first gate electrode and the source electrode are connected to the output terminal and a first signal corresponding to a conduction state of the first transistor is input to the second gate electrode of the second transistor.

6. A semiconductor device comprising:
   an inverter circuit comprising:
   an input terminal;
   an output terminal; and
   a first transistor which is the transistor according to claim 1 and a second transistor connected in series,
   wherein in the first transistor, the first gate electrode is connected to the input terminal and the drain electrode is connected to the output terminal, and
   wherein in the second transistor, one of the first gate electrode and the second gate electrode is connected to the source electrode and the other is connected to the drain electrode.

7. A semiconductor device comprising:
   a transistor comprising:
   an oxide semiconductor layer including a channel formation region;

a first gate electrode and a second gate electrode;
a first insulating layer and a second insulating layer;
a source electrode;
a drain electrode; and
a first electrode and a second electrode,
wherein the first gate electrode faces the oxide semiconductor layer with the first insulating layer interposed therebetween,
wherein the second gate electrode faces the oxide semiconductor layer with the second insulating layer interposed therebetween and a potential or a signal is input to the second gate electrode independently of the first gate electrode,
wherein the second gate electrode is interposed between the first electrode and the second electrode,
wherein the first electrode is in contact with the first gate electrode in a first opening in the first insulating layer and the second insulating layer, and the second electrode is in contact with the first gate electrode in a second opening in the first insulating layer and the second insulating layer, and
wherein the oxide semiconductor layer comprises:
a first side surface in contact with the source electrode and a second side surface in contact with the drain electrode;
a third side surface facing the first electrode with the second insulating layer interposed therebetween and without the source electrode and the drain electrode interposed therebetween; and
a fourth side surface that is opposite to the third side surface and faces the second electrode with the second insulating layer interposed therebetween and without the source electrode and the drain electrode interposed therebetween.

8. The semiconductor device according to claim 7, wherein a channel length of the transistor is greater than or equal to 0.5 μm and less than or equal to 2 μm.

9. The semiconductor device according to claim 7,
wherein the oxide semiconductor layer comprises at least an oxide semiconductor film and a metal oxide film over and in contact with the oxide semiconductor film,
wherein the oxide semiconductor film includes the channel formation region and has a thickness of greater than or equal to 100 nm, and
wherein the metal oxide film has a thickness of greater than or equal to 50 nm.

10. The semiconductor device according to claim 9,
wherein the oxide semiconductor film comprises an In—Ga—Zn oxide, and
wherein the metal oxide film comprises an In—Ga oxide.

11. A semiconductor device comprising:
a transistor comprising:
an oxide semiconductor layer including a channel formation region;
a first gate electrode;
a first insulating layer and a second insulating layer;
a source electrode;
a drain electrode; and
a first electrode and a second electrode,
wherein the first gate electrode faces the oxide semiconductor layer with the first insulating layer interposed therebetween,
wherein the first electrode is in contact with the first gate electrode in a first opening in the first insulating layer and the second insulating layer and the second electrode is in contact with the first gate electrode in a second opening in the first insulating layer and the second insulating layer, and
wherein the oxide semiconductor layer comprises:
a first side surface in contact with the source electrode and a second side surface in contact with the drain electrode;
a third side surface facing the first electrode with the second insulating layer interposed therebetween and without the source electrode and the drain electrode interposed therebetween; and
a fourth side surface that is opposite to the third side surface and faces the second electrode with the second insulating layer interposed therebetween and without the source electrode and the drain electrode interposed therebetween.

12. The semiconductor device according to claim 11, wherein a channel length of the transistor is greater than or equal to 0.5 μm and less than or equal to 2 μm.

13. The semiconductor device according to claim 11,
wherein the oxide semiconductor layer comprises at least an oxide semiconductor film and a metal oxide film over and in contact with the oxide semiconductor film,
wherein the oxide semiconductor film includes the channel formation region and has a thickness of greater than or equal to 100 nm, and
wherein the metal oxide film has a thickness of greater than or equal to 50 nm.

14. The semiconductor device according to claim 13,
wherein the oxide semiconductor film comprises an In—Ga—Zn oxide, and
wherein the metal oxide film comprises an In—Ga oxide.

15. A clocked inverter circuit comprising:
first to third input terminals;
an output terminal; and
first to third transistors connected in series,
wherein a first clock signal and a second clock signal are input to the second input terminal and the third input terminal,
wherein each of the first to third transistors comprises:
an oxide semiconductor layer including a channel formation region;
a first gate electrode facing the oxide semiconductor layer with a first insulating layer interposed therebetween, and a second gate electrode facing the oxide semiconductor layer with a second insulating layer interposed therebetween;
a source electrode; and
a drain electrode,
wherein in the first transistor, the second gate electrode and the second input terminal are connected to the first gate electrode,
wherein in the second transistor, the second gate electrode and the first input terminal are connected to the first gate electrode and the output terminal is connected to the drain electrode,
wherein in the third transistor, one of the first gate electrode and the second gate electrode is connected to the third input terminal and the other is connected to the output terminal,
wherein in the first transistor and the second transistor, the second gate electrode is in contact with the first gate electrode in at least one first opening in the first insulating layer and the second insulating layer, and the oxide semiconductor layer comprises:
a first side surface in contact with the source electrode and a second side surface in contact with the drain electrode; and at least one third side surface facing the second gate electrode with the second insulating layer interposed therebetween and without the source electrode and the drain electrode interposed therebetween, wherein the third transistor further comprises a first electrode and a second electrode over the second insulating layer, the second gate electrode of the third transistor being interposed between the first electrode and the second electrode, and wherein in the third transistor, the first electrode is in contact with the first gate electrode in a first opening in the first insulating layer and the second insulating layer, and the second electrode is in contact with the first gate electrode in a second opening in the first insulating layer and the second insulating layer, and wherein in the third transistor, a top surface of the oxide semiconductor layer overlaps with the first electrode and the second electrode with the second insulating layer interposed therebetween, and the oxide semiconductor layer comprises:
- a fourth side surface in contact with the source electrode and a fifth side surface in contact with the drain electrode;
- a sixth side surface facing the first electrode with the second insulating layer interposed therebetween and without the source electrode and the drain electrode interposed therebetween; and
- a seventh side surface that is opposite to the sixth side surface and faces the second electrode with the second insulating layer interposed therebetween and without the source electrode and the drain electrode interposed therebetween.

16. A sequential circuit comprising:
a first clocked inverter circuit; and
a loop circuit to which an output of the first clocked inverter circuit is input and which comprises a first inverter circuit and a second clocked inverter circuit,
wherein the first clocked inverter circuit and the second clocked inverter circuit are each the clocked inverter circuit according to claim 15, and
wherein a transistor of the first inverter circuit comprises a channel formation region in an oxide semiconductor layer.

17. A semiconductor device comprising the sequential circuit according to claim 16.

18. A semiconductor device comprising a shift register, the shift register comprising the sequential circuit according to claim 16.

19. A semiconductor device comprising:
a gate driver circuit comprising a first shift register; and
a source driver circuit comprising a second shift register,
wherein at least one of the first shift register and the second shift register comprises the sequential circuit according to claim 16.

* * * * *